(12) United States Patent
Ma et al.

(10) Patent No.: US 11,133,832 B2
(45) Date of Patent: Sep. 28, 2021

(54) DATA PROCESSING METHOD AND DEVICE

(71) Applicant: HUAWEI TECHNOLOGIES CO., LTD., Guangdong (CN)

(72) Inventors: Liang Ma, Shanghai (CN); Chen Zheng, Shanghai (CN); Xin Zeng, Shenzhen (CN); Yuejun Wei, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 147 days.

(21) Appl. No.: 16/531,956

(22) Filed: Aug. 5, 2019

(65) Prior Publication Data

US 2019/0356341 A1 Nov. 21, 2019

Related U.S. Application Data

(63) Continuation of application No. PCT/CN2018/075290, filed on Feb. 5, 2018.

(30) Foreign Application Priority Data

Feb. 6, 2017 (CN) .......................... 201710065944.0
Mar. 3, 2017 (CN) .......................... 201710127438.X

(51) Int. Cl.
*G11C 16/26* (2006.01)
*G06F 11/10* (2006.01)
(Continued)

(52) U.S. Cl.
CPC ....... *H03M 13/39* (2013.01); *H03M 13/1148* (2013.01); *H03M 13/27* (2013.01)

(58) Field of Classification Search
CPC .. H03M 13/39; H03M 13/1148; H03M 13/27; H03M 13/271; H03M 13/116;
(Continued)

(56) References Cited

U.S. PATENT DOCUMENTS 6,029,264 A * 2/2000 Kobayashi ............ H03M 13/29
714/755
7,346,832 B2 * 3/2008 Richardson .......... H03M 13/611
714/779
(Continued)

FOREIGN PATENT DOCUMENTS

CN 101388743 A 3/2009
CN 101843025 A 9/2010
(Continued)

OTHER PUBLICATIONS

Gallager, "Low-density parity-check codes," IRE Transactions on Information Theory, 1962, 8(1): 21-28.
(Continued)

*Primary Examiner* — Guy J Lamarre
(74) *Attorney, Agent, or Firm* — Fish & Richardson P.C.

(57) ABSTRACT

Embodiments of this application disclose a data processing method and a data processing device. The method includes: obtaining a first to-be-processed bit sequence, where the first to-be-processed bit sequence is a transport block or a code block generated by performing code block segmentation on a transport block; encoding the first to-be-processed bit sequence to obtain a first encoded bit sequence; storing all or at least some bits of the first encoded bit sequence into a circular buffer; and outputting a first output bit sequence from the bits stored in the circular buffer. According to the method and the device that are provided in this application, rate matching can be implemented for a sequence generated through LDPC encoding.

20 Claims, 17 Drawing Sheets

(51) Int. Cl.
*G11C 16/04* (2006.01)
*H03M 13/39* (2006.01)
*H03M 13/11* (2006.01)
*H03M 13/27* (2006.01)

(58) Field of Classification Search
CPC .... H03M 13/6362; H04L 1/0057; H04L 1/18; H04L 1/0013; H04L 1/0071
See application file for complete search history.

(56) References Cited

U.S. PATENT DOCUMENTS

| | | | |
|---|---|---|---|
| 8,171,383 B2 | 5/2012 | Landau et al. | |
| 9,819,445 B1* | 11/2017 | Patel | H04L 1/0052 |
| 9,992,819 B2* | 6/2018 | Mukherjee | H04L 1/0009 |
| 10,637,618 B2* | 4/2020 | Xu | H04L 1/1819 |
| 2002/0165004 A1* | 11/2002 | Chen | H04L 1/208 455/522 |
| 2003/0053557 A1* | 3/2003 | Simon | H04L 1/006 375/308 |
| 2011/0135039 A1* | 6/2011 | Limberg | H04N 21/2383 375/340 |
| 2012/0110406 A1 | 5/2012 | Sun et al. | |
| 2013/0272291 A1 | 10/2013 | Mukherjee et al. | |
| 2017/0117922 A1* | 4/2017 | Park | H03M 13/2792 |
| 2017/0170925 A1 | 6/2017 | Xu et al. | |
| 2018/0294921 A1* | 10/2018 | Miyata | H03M 13/2703 |

FOREIGN PATENT DOCUMENTS

| | | |
|---|---|---|
| CN | 101867443 A | 10/2010 |
| CN | 101960736 A | 1/2011 |
| CN | 102412842 A | 4/2012 |
| CN | 102447521 A | 5/2012 |
| CN | 105306165 A | 2/2016 |
| WO | 2015065104 A1 | 5/2015 |

OTHER PUBLICATIONS

PCT International Search Report and Written Opinion issued in International Application No. PCT/CN2018/075290 dated Apr. 27, 2018, 16 pages (with English translation).

MediaTek, "Discussion on the bit-reordering of an LDPC code block," 3GPP TSG-RAN WG1 #87,R1-1612133, Reno, USA, Nov. 14-18, 2016, 13 pages.

Office Action issued in Chinese Application No. 201710127438.X dated Jun. 11, 2020, 12 pages.

ZTE, ZTE Microelectronics, "Evaluation on Channel coding candidates for eMBB control channel," 3GPP TSG RAN WG1 #87, R1-1613078, Reno, USA, Nov. 14-18, 2016, 17 pages.

Extended European Search Report issued in European Application No. 18748349.0 dated Dec. 9, 2019, 9 pages.

R1-166770—Samsung, "Discussion on Rate-Compatible Quasi-Cyclic LDPC Codes," 3GPP DRAFT; 3GPP TSG RAN WG1 #86, Gothenburg, Sweden, XP051142461, Aug. 2016, 6 pages.

R1-1611855—LG Electronics, "Considerations on channel coding chain for eMBB," 3GPP DRAFT; 3GPP TSG RAN WG1 Meeting #87, Reno, USA, XP051175823, Nov. 2016, 3 pages.

R1-1700110—Ericsson, "On LDPC Code Parameters for NR," 3GPP DRAFT; 3GPP TSG RAN WG1 AH_NR Meeting, Spokane, USA, XP051202618, Jan. 2017, 8 pages.

R1-1700830—Qualcomm Incorporated, "LDPC rate compatible design," 3GPP DRAFT; 3GPP TSG-RAN WG1 NR Ad Hoc, Spokane, USA, XP051203143, Jan. 2017, 19 pages.

* cited by examiner

DATA PROCESSING METHOD AND DEVICE

CROSS-REFERENCE TO RELATED APPLICATIONS

This application is a continuation of International Application No. PCT/CN2018/075290, filed on Feb. 5, 2018, which claims priority to Chinese Patent Application No. 201710065944.0, filed on Feb. 6, 2017, and Chinese Patent Application No. 201710127438.X, filed on Mar. 3, 2017. All of the aforementioned patent applications are hereby incorporated by reference in their entireties.

TECHNICAL FIELD

This application relates to the wireless communications field, and in particular, to a data processing method and device.

BACKGROUND

A quasi-cyclic low-density parity-check code (QC-LDPC for short) is a type of linear block code having a sparse check matrix. The QC-LDPC has good performance closing to a Shannon limit, has and is characterized by a flexible structure and relatively low decoding complexity, and therefore can be widely applied to various communications systems.

To meet various requirements for different code lengths and code rates, after an information bit sequence is encoded by using an LDPC parity check matrix to generate an encoded sequence, rate matching further needs to be performed on the encoded sequence, so that a code rate of the encoded sequence is adjusted to a code rate meeting a system transmission requirement. Therefore, a data processing method is urgently required, to implement rate matching on a sequence generated through LDPC encoding.

SUMMARY

This application provides a data processing method and device, to implement rate matching on a sequence generated through LDPC encoding.

According to a first aspect, an embodiment of the present invention provides a data processing method, including: obtaining a first to-be-processed bit sequence, where the first to-be-processed bit sequence is a transport block or a code block generated by performing code block segmentation on a transport block; encoding the first to-be-processed bit sequence to obtain a first encoded bit sequence; storing all or at least some bits of the first encoded bit sequence into a circular buffer; and outputting a first output bit sequence from the bits stored in the circular buffer.

In a possible design, the obtaining a first to-be-processed bit sequence includes: obtaining the transport block; and generating, based on the transport block, N bit sequences that include the first to-be-processed bit sequence, where N is an integer greater than 0.

In a possible design, the method further includes: interleaving the first output bit sequence.

In a possible design, the method further includes: generating a vector sequence based on the first output bit sequence, where the vector sequence includes Q vectors of the first output bit sequence, where each vector of the first output bit sequence includes at least one bit of the first output bit sequence, and Q is a positive integer; and interleaving the vector sequence.

In a possible design, the vector sequence further includes vectors generated based on a second output bit sequence, and each vector of the second output bit sequence includes at least one bit of the second output bit sequence.

In a possible design, the interleaving the vector sequence includes: interleaving the vectors included in the vector sequence.

In a possible design, the interleaving the vector sequence includes: performing intra-vector-subsequence interleaving on each vector subsequence included in the vector sequence to obtain M interleaved subsequences, where the vector sequence includes M vector subsequences, and a quantity of vectors included in each vector subsequence is a positive integer multiple of a quantity of vectors included in a time domain symbol on a channel used to transmit the transport block within one transmission time interval; and concatenating the M interleaved subsequences.

According to a second aspect, an embodiment of the present invention provides a data processing method, including: obtaining a first to-be-processed bit sequence, where the first to-be-processed bit sequence is a transport block or a code block generated by performing code block segmentation on a transport block; encoding the first to-be-processed bit sequence to obtain a first encoded bit sequence; performing bit reordering on the first encoded bit sequence to obtain a first reordered bit sequence; storing all or at least some bits of the first reordered bit sequence into a circular buffer; and outputting a first output bit sequence from the bits stored in the circular buffer.

In a possible design, the performing bit reordering on the first encoded bit sequence includes at least one of the following operations: changing a position of a first subsequence in the first encoded bit sequence, where a length of the first subsequence is a positive integer multiple of a lifting factor; or deleting a second subsequence in the first encoded bit sequence, where a length of the second subsequence is a positive integer multiple of a lifting factor.

In a possible design, the second subsequence includes at least one information bit, or the first subsequence includes at least one parity bit.

In a possible design, the performing bit reordering on the first encoded bit sequence includes: obtaining a punctured sequence and an interleaved redundancy sequence, where the punctured sequence is a sequence obtained by puncturing an information bit sequence, and the interleaved redundancy sequence is a sequence obtained by performing bit reordering on a first redundancy sequence; and concatenating the punctured sequence, the interleaved redundancy sequence, and a second redundancy sequence to obtain the first reordered bit sequence, where the information bit sequence includes information bits included in the first to-be-processed bit sequence, and the first redundancy sequence includes redundancy bits that are generated by encoding the first to-be-processed bit sequence by using a core matrix of an LDPC parity check matrix, and the second redundancy sequence includes redundancy bits that are generated by encoding the first to-be-processed bit sequence by using a extended matrix of the LDPC parity check matrix.

In a possible design, the performing bit reordering on a first redundancy sequence includes: reordering, according to a selected interleaving pattern, subsequences included in the first redundancy sequence, where each subsequence includes redundancy bits that are generated by encoding the information bit sequence by using a column for parity bits of the core matrix.

According to a third aspect, to implement the data processing method in the first aspect, an embodiment of the present invention provides a data processing device, and the device has a function of implementing the data processing method in the various embodiments of the first aspect. The function may be implemented by hardware, or may be implemented by hardware by executing corresponding software. The hardware or the software includes one or more modules corresponding to the function.

In a possible design, the data processing device includes: an obtaining unit, configured to obtain a first to-be-processed bit sequence, where the first to-be-processed bit sequence is a transport block or a code block generated by performing code block segmentation on a transport block; an encoding unit, configured to encode the first to-be-processed bit sequence to obtain a first encoded bit sequence; a saving unit, configured to save all or at least some bits of the first encoded bit sequence into a circular buffer; and an output unit, configured to output a first output bit sequence from the circular buffer.

In a possible design, the obtaining unit includes: an obtaining subunit, configured to obtain the transport block; and a generation subunit, configured to generate, based on the transport block, N bit sequences that include the first to-be-processed bit sequence, where N is an integer greater than 0.

In a possible design, the device further includes a first interleaving unit, configured to interleave the first output bit sequence.

In a possible design, the device further includes a second interleaving unit, configured to: generate a vector sequence based on the first output bit sequence, where the vector sequence includes Q vectors of the first output bit sequence, each vector of the first output bit sequence includes at least one bit of the first output bit sequence, and Q is a positive integer; and interleave the vector sequence.

In a possible design, the vector sequence further includes vectors generated based on a second output bit sequence, and each vector of the second output bit sequence includes at least one bit of the second output bit sequence.

In a possible design, the second interleaving unit is specifically configured to interleave the vectors included in the vector sequence.

In a possible design, the second interleaving unit is specifically configured to: perform intra-vector-subsequence interleaving on each vector subsequence included in the vector sequence to obtain M interleaved subsequences, where the vector sequence includes M vector subsequences, and a quantity of vectors included in each vector subsequence is a positive integer multiple of a quantity of vectors included in a time domain symbol on a channel used to transmit the transport block within one transmission time interval; and concatenate the M interleaved subsequences.

According to a fourth aspect, to implement the data processing method in the second aspect, an embodiment of the present invention provides a data processing device, and the device has a function of implementing the data processing method in the various embodiments of the second aspect. The function may be implemented by hardware, or may be implemented by hardware by executing corresponding software. The hardware or the software includes one or more modules corresponding to the function.

In a possible design, the data processing device includes: an obtaining unit, configured to obtain a first to-be-processed bit sequence, where the first to-be-processed bit sequence is a transport block or a code block generated by performing code block segmentation on a transport block; an encoding unit, configured to encode the first to-be-processed bit sequence to obtain a first encoded bit sequence; a reordering unit, configured to perform bit reordering on the first encoded bit sequence to obtain a first reordered bit sequence; a saving unit, configured to save all or at least some bits of the first reordered bit sequence into a circular buffer; and an output unit, configured to output a first output bit sequence from the bits stored in the circular buffer.

In a possible design, the reordering unit is specifically configured to: change a position of a first subsequence in the first encoded bit sequence, where a length of the first subsequence is a positive integer multiple of a lifting factor; or delete a second subsequence in the first encoded bit sequence, where a length of the second subsequence is a positive integer multiple of a lifting factor.

In a possible design, the second subsequence includes at least one information bit, or the first subsequence includes at least one pairty bit.

In a possible design, the reordering unit is specifically configured to: obtain a punctured sequence and an interleaved redundancy sequence, where the punctured sequence is a sequence obtained by puncturing an information bit sequence, and the interleaved redundancy sequence is a sequence obtained by performing bit reordering on a first redundancy sequence; and concatenate the punctured sequence, the interleaved redundancy sequence, and a second redundancy sequence to obtain bits of the first reordered bit sequence, where the information bit sequence includes information bits included in the first to-be-processed bit sequence, the first redundancy sequence includes redundancy bits that are generated by encoding the first to-be-processed bit sequence by using a core matrix of an LDPC parity check matrix, and the second redundancy sequence includes redundancy bits that are generated by encoding the first to-be-processed bit sequence by using a extended matrix of the LDPC parity check matrix.

In a possible design, the reordering unit is further configured to reorder, according to a selected interleaving pattern, subsequences included in the first redundancy sequence, where each subsequence includes redundancy bits that are generated by encoding the information bit sequence by using a column for parity bits of the core matrix.

According to a fifth aspect, an embodiment of the present invention further provides a data processing device. The device includes a processor, a memory, and a transceiver. The processor may execute a program or an instruction stored in the memory, to implement the data processing method in various implementations of the first aspect and the second aspect.

According to a sixth aspect, an embodiment of the present invention provides a storage medium. The storage medium may store a program. When the program is executed, some or all steps in the embodiments of the first aspect and the second aspect provided in the embodiments of the present invention may be implemented.

According to the data processing method and device provided in the embodiments of the present invention, rate matching can be implemented for a sequence generated through LDPC encoding.

DESCRIPTION OF DRAWINGS

To describe the technical solutions in this application more clearly, the following briefly describes the accompanying drawings required for describing the embodiments. Apparently, a person of ordinary skill in the art may derive other drawings from these accompanying drawings without creative efforts.

DESCRIPTION OF EMBODIMENTS

Figure 1:
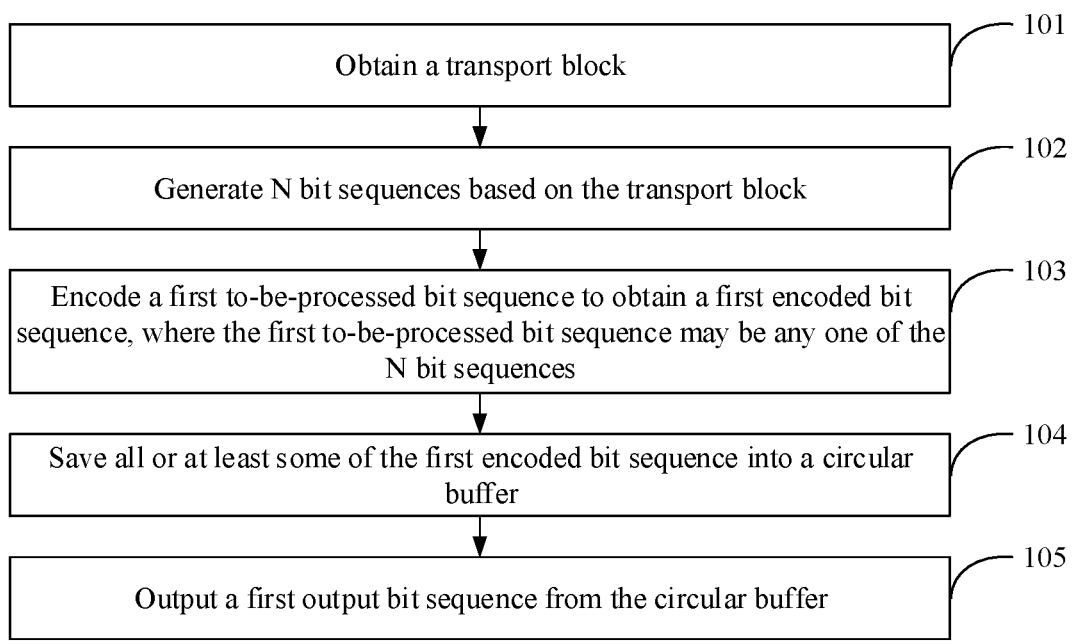
FIG. 1 is a schematic flowchart of an embodiment of a data processing method according to this application.

FIG. 1 is a flowchart of an embodiment of a data processing method according to this application.

Step 101: A data processing device obtains a transport block.

The data processing device may first obtain to-be-transmitted data, and generate a transport block (transport block, TB) corresponding to the to-be-transmitted data. A length of the transport block may be a predetermined value.

If the to-be-transmitted data does not include parity check information, the data processing device may attached the parity check information to the to-be-transmitted data, to obtain the transport block. If the to-be-transmitted data includes the parity check information, the data processing device may directly use the obtained to-be-transmitted data as the transport block. For example, if the to-be-transmitted data does not include the parity check information, the data processing device may attach corresponding cyclic redundancy check (cyclical redundancy check, CRC) check bits to the to-be-transmitted data, to obtain the transport block.

Step 102: Generate N bit sequences based on the transport block.

If a length of the transport block is not greater than a length of data that can be encoded by an encoder each time, the transport block may be directly used as a first to-be-processed bit sequence. If the length of the transport block is greater than the length of data that can be encoded by the encoder each time, after obtaining the transport block, the data processing device may generate the N bit sequences based on the transport block. A length of each bit sequence may also be a predetermined value. A value of N is a positive integer, and a length of a data block may be less than or equal to the length of data that can be encoded by the encoder each time. When the value of N is greater than 1, each data block may have a predetermined length. Generally, the length of the data block, the length of the bit sequence, and the value of N may all be preset in a wireless communications system.

The data processing device may perform data block (code block, CB) segmentation on the transport block based on a preset parameter and a preset segmentation manner, to obtain N data blocks, where a data block may also be referred to as a code block. After the N data blocks are generated, the data processing device may directly use each data block obtained through segmentation as a bit sequence, or may attach corresponding CRC check bits to each data block, and then use the data block attached with the CRC check bits as a bit sequence, to obtain the N bit sequences. Alternatively, the data blocks are divided into a plurality of groups of data blocks, and corresponding CRC check bits are attached to each group of data blocks. A group of data blocks may include a plurality of data blocks, and may also be referred to as a code block group, and a feedback may be transmitted on a basis of a code block group during transmission.

Step 103: Encode the first to-be-processed bit sequence to obtain a first encoded bit sequence, where the first to-be-processed bit sequence may be any one of the N bit sequences.

The data processing device may perform LDPC encoding on the first to-be-processed bit sequence to obtain the first encoded bit sequence. The LDPC parity check matrix may be obtained by the data processing device based on a base matrix, or stored by the data processing device, or obtained by the data processing device from another device. A specific process of encoding the first to-be-processed bit sequence by using the LDPC parity check matrix is not described herein.

Step 104: Save all or at least some bits of the first encoded bit sequence into a circular buffer.

If the first to-be-processed bit sequence includes k bits, and the first encoded bit sequence includes n bits of code words (code word), a code rate supported by an LDPC mother code is R=k/n. If the first encoded bit sequence is greater than a maximum encoded bit sequence $n_{max}$, or an LDPC code rate is less than a minimum supported code rate $R_{min}$, the data processing device further needs to truncate the first encoded bit sequence based on different processing capabilities of different receiving devices, and then input a truncated first encoded bit sequence into the circular buffer.

The data processing device performs rate matching on the first encoded bit sequence in a plurality of manners. Generally, the data processing device may separately perform rate matching on the first encoded bit sequence by using the circular buffer (circular buffer), to generate a first output bit sequence.

If rate matching is implemented by using the circular buffer, the data processing device may first determine a size $N_{CB}$ of the circular buffer of the data processing device based on a processing capability of a receiving device. If the size of the circular buffer is greater than or equal to a length of the first encoded bit sequence, the first encoded bit sequence may be directly stored into the circular buffer. If the size of the circular buffer is less than the length of the first encoded bit sequence, after a part exceeding $N_{CB}$ in the first encoded bit sequence is deleted, a remaining part may be written into the virtual buffer.

A value of $N_{CB}$ may be determined in different manners based on different application scenarios.

In an implementation, if a size of the first encoded bit sequence of the data processing device is $K_W$, an a maximum transport block size (transport block size) that is supported by a virtual buffer (soft buffer) of a receiving device and that is calculated based on a decoding capability of the receiving device is $N_{IR}$. In this case, a quantity of data blocks (code block) is C, and $$N_{CB} = \min\left(K_W, \left\lfloor \frac{N_{IR}}{C} \right\rfloor\right),$$

where a value of $N_{IR}$ is preset in a system based on different decoding capabilities of receiving devices, and may have a plurality of different levels.

In another implementation, if a size of the first encoded bit sequence of the data processing device is $K_W$, a minimum LDPC mother code rate (corresponding to the LDPC matrix) supported by a receiving device is $R_t$, a currently to-be-transmitted transport block size (transport block size) is $K_{IR,send}$, and a quantity of data blocks is C, $$N_{CB} = \min\left(K_W, \left\lfloor \frac{K_{IR,send}}{C \cdot R_t} \right\rfloor\right).$$

In still another implementation, if not only a transport block buffer of a receiving device is limited, but also a decoding capability of the receiving device is limited, a formula may be represented as $$N_{CB} = \min\left(K_W, \left\lfloor \frac{N_{IR}}{C} \right\rfloor, \left\lfloor \frac{K_{IR,send}}{C \cdot R_t} \right\rfloor\right) \text{ or}$$

$$N_{CB} = \min\left(K_W, \left\lfloor \frac{N_{IR}}{C} \right\rfloor, \left\lfloor \frac{K_{CB}}{R_t} \right\rfloor\right).$$

If not only the transport block buffer of the receiving device is limited, but also a circular buffer used for each code block is limited, a formula may be represented as $$N_{CB} = \min\left(K_W, \left\lfloor \frac{N_{IR}}{C} \right\rfloor, N_{CB,t}\right).$$

In yet another implementation, if a size of the first encoded bit sequence of the data processing device is $K_W$, and a maximum size of each code block of a receiving device is $N_{CB,t}$, $K_{CB}=\min(K_W, N_{CB,t})$ where a value of $N_{CB,t}$ is preset in a system based on different decoding capabilities of receiving devices, and may have a plurality of different levels.

It can be learned that the circular buffer of the data processing device may be configured to store all or some bits of the first encoded bit sequence in step 103, so as to perform rate matching.

Step 105: Output a first output bit sequence from the circular buffer.

After storing all or at least some bits of the first encoded bit sequence into the circular buffer, the data processing device may output, starting from a selected starting position of the circular buffer, a bit segment with a predetermined length to obtain the first output bit sequence. The selected starting position may be a starting position of a redundancy version of the virtual buffer, and the predetermined length may be a redundancy version length indicated by system control information.

In a process of outputting the bit segment, if a length of the bit segment does not reach the predetermined length when a bit at the end of the virtual buffer is outputted, a bit at the beginning of the circular buffer may be continuously outputted, until the length of the bit segment reaches the predetermined length, and an output bit segment $e_0$, $e_1, \ldots, e_{E-1}$ is obtained, where E represents a length of the output bit segment.

When a preset maximum quantity of redundancy versions is $j_{max}$, $j_{max}$ redundancy versions may be denoted as $RV_0$, $RV_1, \ldots, RV_{j_{max}}$, respectively, representing that starting positions of these redundancy versions may be denoted as $rv_0, rv_1, \ldots, rv_{i_{max}}$, where $i_{max}$ represents a maximum quantity of starting positions of redundancy versions, $rv_i<rv_{i+1}$, $i=0, 1, \ldots, i_{max-2}$, $rv_0$ indicates the first bit in the circular buffer, values of $rv_1, \ldots, rv_{i_{max}}$ may be directly preset in a system, or may be calculated according to a preset formula. Assuming that block lengths of the redundancy versions $RV_0, Rv_1, \ldots, RV_j$ are $E_{RV_0}, E_{RV_1}, \ldots, E_{RV_j}$, and j redundancy versions are currently sent, an equivalent code rate of the first output bit sequence may be represented as $$R = k \bigg/ \sum_{x=0}^{j} E_{RV_x}.$$

It should be noted herein that step 103 to step 105 are all described by using only an example that the value of N is 1, in other words, by using one to-be-processed bit sequence as an example. If the value of N is greater than 1 or there is more than one to-be-processed bit sequence, the data processing device may separately generate, according to the method described in step 103 to step 105, an output bit sequence corresponding to each to-be-processed bit sequence.

When the value of N is greater than 1, the data processing device may generate, in a parallel manner, each output bit sequence corresponding to each to-be-processed bit sequence, or may generate, one by one in a serial manner, an output bit sequence corresponding to each to-be-processed bit sequence.

When rate matching is performed by using the circular buffer, to obtain better decoding performance, according to different lengths of the generated first output bit sequence, some bits of the first encoded bit sequence may need to be deleted or some bits of the first encoded bit sequence may be first sent. The data processing device may further perform bit reordering on the first encoded bit sequence to obtain a first reordered bit sequence, and then store all or at least some bits of a second bit sequence into the circular buffer.

Figure 2:
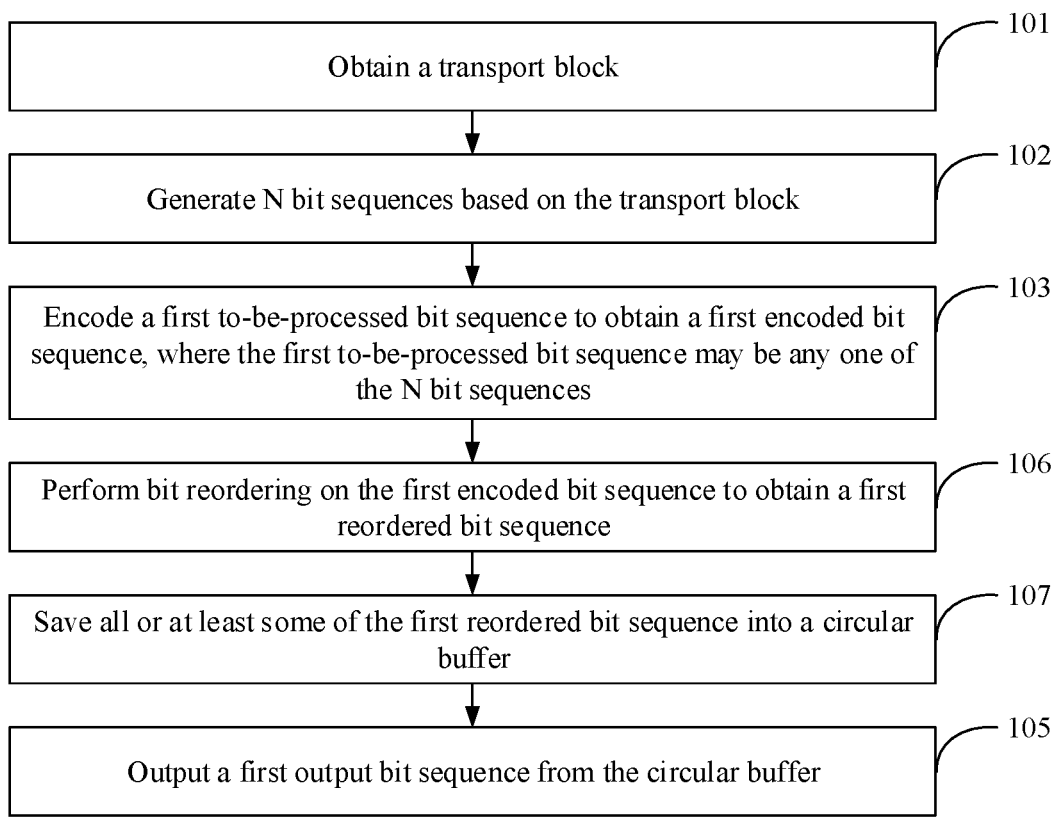
FIG. 2 is a schematic flowchart of another embodiment of a data processing method according to this application.

As shown in FIG. 2, in another embodiment, step 104 may be replaced with step 106 and step 107.

Step 106: Perform bit reordering on the first encoded bit sequence to obtain a first reordered bit sequence.

The data processing device may perform bit reordering on the first encoded bit sequence by using a bit reordering method, to obtain bits of the first reordered bit sequence. The performing bit reordering on the first encoded bit sequence includes at least one of the following operations: changing a position of a first subsequence in the first encoded bit sequence, where a length of the first subsequence is a positive integer multiple of a lifting factor; or deleting a second subsequence in the first encoded bit sequence, where a length of the second subsequence is a positive integer multiple of a lifting factor. In other words, the first reordered bit sequence is obtained by changing the position of the first subsequence in the first encoded bit sequence, or the first reordered bit sequence is obtained by deleting the second subsequence in the first encoded bit sequence.

In an implementation, the first subsequence may include at least one parity bit, and the second subsequence includes at least one information bit. Changing the position of the first subsequence may be exchanging the position of the first subsequence with a position of another subsequence, inserting the first subsequence to a specific position in the first encoded bit sequence, or the like.

For example, when the first encoded bit sequence is generated through LDPC encoding, the first encoded bit sequence L is obtained by sequentially concatenating an information bit sequence $L_0$, a first redundancy sequence $L_1$, and a second redundancy sequence $L_2$. $L_0$ includes information bits included in the first to-be-processed bit sequence, $L_1$ includes redundancy bits that are generated by encoding the first to-be-processed bit sequence by using a core matrix of an LDPC parity check matrix, and $L_2$ includes redundancy bits that are generated by encoding the first to-be-processed bit sequence by using a extended matrix of the LDPC parity check matrix. The core matrix is a matrix with at least a complete bi-diagonal or lower triangular structure included in a parity check part of the LDPC parity check matrix. The extended matrix is another matrix in the LDPC parity check matrix except the core matrix.

When the first encoded bit sequence is generated through LDPC encoding, the performing bit reordering on the first encoded bit sequence may include the following steps:

The data processing device may puncture $L_0$, and delete one or more information bits in $L_0$, to obtain a punctured sequence $L'_0$. A quantity of deleted information bits may be an integer multiple of the lifting factor. These deleted information bits may be used as the second subsequence, for example, $L_3$.

In addition to puncturing $L_0$, the data processing device may further change a position of a subsequence of $L_1$, to generate a interleaved redundancy sequence $L'_1$.

After determining $L'_0$, $L'_1$, and $L_2$, the data processing device may sequentially concatenate $L'_0$, $L'_1$, and $L_2$ to obtain the first reordered bit sequence L'; or the data processing device may sequentially concatenate $L'_0$, $L'_1$, $L'_2$, and a punctured bit sequence $L_3$ that includes punctured bits, to obtain bits of the first reordered bit sequence L'. It should be noted herein that an order of puncturing $L_0$ by the data processing device and performing bit reordering on $L_1$ by the data processing device is not limited in this application.

In a process of puncturing $L_0$, the data processing device may first puncture $L_0$ according to a predetermined puncturing rule. A sequence including remaining bits of $L_0$ after the puncturing is the punctured sequence $L'_0$, and a sequence obtained by sequentially concatenating the punctured bits is the punctured bit sequence $L_3$.

When changing a position in $L_1$, the data processing device reorders, according to a selected interleaving pattern, subsequences included in the first redundancy sequence. Each subsequence includes redundancy bits that are generated by encoding the first to-be-processed bit sequence by using a column for parity bits of the core matrix.

In an implementation, the data processing device may first determine an interleaving pattern corresponding to the core matrix, then perform column reordering on the core matrix by using the interleaving pattern, and sort, based on an order of columns of the core matrix in the before-interleaving matrix, subsequences corresponding to the columns of the core matrix, to obtain $L'_1$. Each subsequence includes redundancy bits that are generated by encoding the first to-be-processed bit sequence by using a column for parity bits of the core matrix. A subsequence corresponding to a column of the core matrix is a sequence including redundancy bits that are generated by encoding the first to-be-processed bit sequence by using a column for parity bits.

For example, if an interleaving pattern is $k_b+1$, $k_b+2$, $k_b$, the data processing device may sequentially concatenate a subsequence ($k_b+1$), a subsequence ($k_b+2$), and a subsequence $k_b$. The subsequence $k_b$ includes redundancy bits that are generated by encoding the first to-be-processed bit sequence by using a column $k_b$ of the core matrix of parity bits, the subsequence ($k_b+1$) includes redundancy bits that are generated by encoding the first to-be-processed bit sequence by using a column ($k_b+1$) of the core matrix of parity bits, and the subsequence ($k_b+2$) includes redundancy bits that are generated by encoding the first to-be-processed bit sequence by using a column ($k_b+2$) of the core matrix of parity bits.

For another example, if an interleaving pattern is $k_b+3$, $k_b+1$, $k_b+2$, $k_b$, the data processing device may sequentially concatenate a subsequence ($k_b+3$), a subsequence ($k_b+1$), a subsequence ($k_b+2$), and a subsequence $k_b$. The subsequence $k_b$ includes redundancy bits that are generated by encoding the first to-be-processed bit sequence by using a column $k_b$ of the core matrix of parity bits, the subsequence ($k_b+1$) includes redundancy bits that are generated by encoding the first to-be-processed bit sequence by using a column ($k_b+1$) of the core matrix of parity bits, the subsequence ($k_b+2$) includes redundancy bits that are generated by encoding the first to-be-processed bit sequence by using a column ($k_b+2$) of the core matrix of parity bits, and the subsequence ($k_b+3$) includes redundancy bits that are generated by encoding the first to-be-processed bit sequence by using a column ($k_b+3$) of the core matrix of parity bits.

In addition to the foregoing interleaving patterns, there are other possible interleaving patterns as follows:

Assuming that three columns are to be interleaved, an interleaving pattern is as follows:

$k_b+1, k_b+2, k_b,$ $k_b+1, k_b, k_b+2,$ $k_b, k_b+1, k_b+2,$ or $k_b, k_b+2, k_b+1.$

Assuming that four columns are to be interleaved, an interleaving pattern may be as follows:

$k_b+3, k_b+1, k_b+2, k_b,$ $k_b+1, k_b+3, k_b+2, k_b,$ $k_b+3, k_b+1, k_b, k_b+2,$ $k_b+1, k_b+3, k_b, k_b+2,$ $k_b, k_b+2, k_b+1, k_b+3,$ $k_b+2, k_b, k_b+1, k_b+3,$ $k_b, k_b+2, k_b+3, k_b+1,$ $k_b+2, k_b, k_b+3, k_b+1,$ $k_b, k_b+1, k_b+2, k_b+3,$ or $k_b, k_b+1, k_b+3, k_b+2.$

Assuming that six columns are to be interleaved, an interleaving pattern may be as follows:

$k_b+5, k_b+3, k_b+1, k_b+4, k_b+2, k_b,$ $k_b+1, k_b+3, k_b+5, k_b+4, k_b+2, k_b,$ $k_b+5, k_b+3, k_b+1, k_b, k_b+2, k_b+4,$ $k_b+1, k_b+3, k_b+5, k_b, k_b+2, k_b+4,$ $k_b+4, k_b+2, k_b, k_b+5, k_b+3, k_b+1,$ $k_b+4, k_b+2, k_b, k_b+1, k_b+3, k_b+5,$ $k_b, k_b+2, k_b+4, k_b+5, k_b+3, k_b+1,$ or $k_b, k_b+2, k_b+4, k_b+1, k_b+3, k_b+5.$

Assuming that there is another quantity of to-be-interleaved columns, an interleaving pattern designing principle is as follows:

From subsequences corresponding to the sequence $L_1$, all even-numbered subsequences are first selected and punctured, or all odd-numbered subsequences are first selected and punctured.

Step 107: Store all or at least some bits of the first reordered bit sequence into a circular buffer.

If a size of the circular buffer is greater than or equal to a length of the first reordered bit sequence, the bit sequence may be directly stored into the circular buffer. If the size of the circular buffer is less than the length of the first reordered bit sequence, after a part exceeding $N_{CB}$ in the first reordered bit sequence is deleted, a remaining part may be placed into the virtual buffer. For a manner of determining a value of $N_{CB}$, refer to the foregoing descriptions. Details are not described herein again.

When bit reordering is performed on the first encoded bit sequence by using this implementation, punctured bit(s) may be first discarded or an order of selecting the first redundancy sequence may be changed during generation of the first output bit sequence. This avoids selecting an encoded bit sequence in an incorrect puncturing order, and therefore improves LDPC decoding performance.

It should be noted herein that in addition to the foregoing manner used to perform bit reordering on the first encoded bit sequence, another manner may be used to perform bit reordering on the first encoded bit sequence.

It can be learned that the circular buffer of the data processing device may also be configured to store all or some bits of the first reordered bit sequence in step 106, so as to perform rate matching.

It should be noted herein that only one encoded bit sequence is used for description in step 106 and step 107. If there are a plurality of encoded bit sequences, the manner described in step 106 and step 107 and the manner described in step 105 may be used to generate an output bit sequence corresponding to each encoded bit sequence.

After generating the output bit sequence, the data processing device further needs to interleave the output bit sequence, to obtain a gain in a signal transmission process. The data processing device may perform intra-sequence interleaving on each output bit segment, or may perform inter-bit-segment interleaving on two or more output bit segments. The inter-bit-segment interleaving may further include frequency-domain interleaving or channel interleaving.

It should be noted that, in this embodiment of this application, a bit sequence is also referred to as a bit segment, and a bit subsequence is usually a subset of a bit sequence. The bit subsequence, the bit sequence, and the bit segment each include one or more bits in form. The bit sequence, the bit subsequence, or the bit segment is interleaved at a granularity of a bit.

The following describes an intra-sequence interleaving process by using an example of performing intra-sequence interleaving on one output bit sequence.

Figure 3:
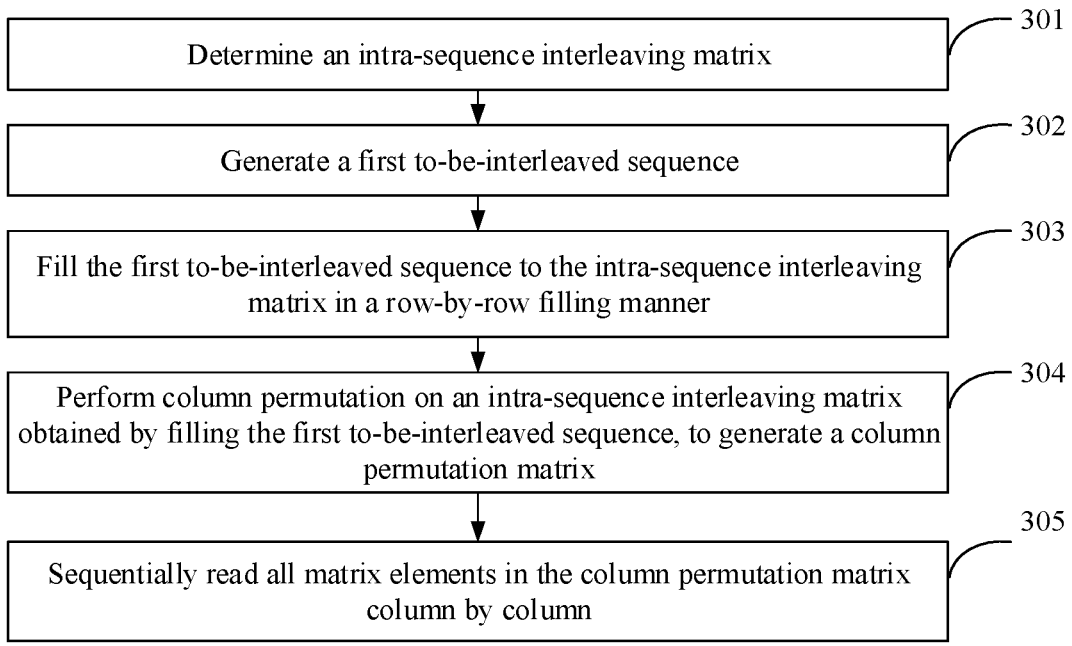
FIG. 3 is a schematic flowchart of another embodiment of a data processing method according to this application.

FIG. 3 is a schematic flowchart of an embodiment of an interleaving method according to this application.

Step 301: Determine an intra-sequence interleaving matrix.

A data processing device may first determine the intra-sequence interleaving matrix. The intra-sequence interleaving matrix has $C_{subblock}^{LDPC}$ columns and $R_{subblock}^{LDPC}$ rows, where $E \leq R_{subblock}^{LDPC} \times C_{subblock}^{LDPC}$, and E is a length of a first output bit sequence. Generally, $C_{subblock}^{LDPC}$ may be a predetermined value, and $R_{subblock}^{LDPC}$ may be a minimum value that meets $E \leq R_{subblock}^{LDPC} \times C_{subblock}^{LDPC}$. The columns in the intra-sequence interleaving matrix are sequentially numbered $0, 1, 2, \ldots, C_{subblock}^{LDPC}-1$ from left to right, and the rows in the intra-sequence interleaving matrix are sequentially numbered $0, 1, 2, \ldots, R_{subblock}^{LDPC}-1$ from top to bottom.

Step 302: Generate a first to-be-interleaved sequence.

In addition to determining the intra-sequence interleaving matrix, the data processing device further needs to generate the first to-be-interleaved sequence.

If $E \leq R_{subblock}^{LDPC} \times C_{subblock}^{LDPC}$, the data processing device may add $N_D = R_{subblock}^{LDPC} \times C_{subblock}^{LDPC} - E$, filler bits (dummy bits) to the front of the first output bit sequence, so as to generate the first to-be-interleaved sequence $Y_1 = y_0, y_1, \ldots, y_{R_{subblock}^{LDPC} \times C_{subblock}^{LDPC}-1}$. When $k=0, 1, \ldots, N_D-1$, $y_k = <NULL>$. When $k=0, 1, \ldots, E$, $y_{N_D+k} = e_k$. $N_D = R_{subblock}^{LDPC} \times C_{subblock}^{LDPC} - E$.

If $E = R_{subblock}^{LDPC} \times C_{subblock}^{LDPC}$, the data processing device may directly use the first output bit sequence as the first to-be-interleaved sequence.

To be specific, when $E < R_{subblock}^{LDPC} \times C_{subblock}^{LDPC}$, the first to-be-interleaved sequence is a sequence generated by adding $N_D$ elements with values <NULL> to the front of the first output bit sequence. When $E=R_{subblock}^{LDPC} \times C_{subblock}^{LDPC}$, the first output bit sequence is the first to-be-interleaved sequence.

It should be noted herein that an order of performing step 301 and step 302 is not limited in this application.

Step 303: Fill the first to-be-interleaved sequence to the intra-sequence interleaving matrix in a row-by-row filling manner.

After generating the first to-be-interleaved sequence, the data processing device may fill the first to-be-interleaved sequence into the intra-sequence interleaving matrix in the row-by-row filling manner.

Step 304: Perform column permutation on an intra-sequence interleaving matrix obtained by filling the first to-be-interleaved sequence, so as to generate a column permutation matrix.

After filling the first to-be-interleaved sequence into the intra-sequence interleaving matrix in the row-by-row filling manner, the data processing device may perform, according to a preset column permutation pattern, column permutation on the intra-sequence interleaving matrix obtained by filling the first to-be-interleaved sequence, so as to generate the column permutation matrix.

The column permutation pattern may be obtained by looking up a table. The column permutation pattern may be represented as $\langle p(j) \rangle_{j \in \{0,1,\ldots,N-1\}}$, where p(j) is an original column number of a column j after the column permutation.

Table 1 shows an example of an interleaving pattern:

TABLE 1

| Quantity $C_{subblock}^{LDPC}$ of interleaved columns | Interleaving pattern <P(0), P(1), P(2), . . . , P($C_{subblock}^{LDPC}$ − 1)> |
|---|---|
| 32 | <0, 16, 8, 24, 4, 20, 12, 28, 2, 18, 10, 26, 6, 22, 14, 30, 1, 17, 9, 25, 5, 21, 13, 29, 3, 19, 11, 27, 7, 23, 15, 31> |

For example, a matrix before column permutation may be represented as:

$$\begin{bmatrix} y_0 & y_1 & y_2 & \cdots & y_{C_{subblock}^{LDPC}-1} \\ y_{C_{subblock}^{LDPC}} & y_{C_{subblock}^{LDPC}+1} & y_{C_{subblock}^{LDPC}+2} & \cdots & y_{2 \cdot C_{subblock}^{LDPC}-1} \\ \vdots & \vdots & \vdots & \ddots & \vdots \\ y_{(R_{subblock}^{LDPC}-1) \times C_{subblock}^{LDPC}} & y_{(R_{subblock}^{LDPC}-1) \times C_{subblock}^{LDPC}+1} & y_{(R_{subblock}^{LDPC}-1) \times C_{subblock}^{LDPC}+2} & \cdots & y_{(R_{subblock}^{LDPC} \times C_{subblock}^{LDPC}-1)} \end{bmatrix}$$

A matrix obtained through column permutation may be represented as:

$$\begin{bmatrix} y_{p(0)} & y_{p(1)} & y_{p(2)} & \cdots & y_{p(C_{subblock}^{LDPC}-1)} \\ y_{p(0)+C_{subblock}^{LDPC}} & y_{p(1)+C_{subblock}^{LDPC}+1} & y_{p(2)+C_{subblock}^{LDPC}+2} & \cdots & y_{p(C_{subblock}^{LDPC}-1)+2 \cdot C_{subblock}^{LDPC}-1} \\ \vdots & \vdots & \vdots & \ddots & \vdots \\ y_{p(0)+(R_{subblock}^{LDPC}-1) \times C_{subblock}^{LDPC}} & y_{p(1)+(R_{subblock}^{LDPC}-1) \times C_{subblock}^{LDPC}+1} & y_{p(2)+(R_{subblock}^{LDPC}-1) \times C_{subblock}^{LDPC}+2} & \cdots & y_{p(C_{subblock}^{LDPC}-1)+(R_{subblock}^{LDPC} \times C_{subblock}^{LDPC}-1)} \end{bmatrix}$$

Step 305: Sequentially read all matrix elements in the column permutation matrix column by column.

After the column permutation matrix is generated, all the matrix elements in the column permutation matrix are sequentially read column by column. A sequence obtained by sequentially reading all the matrix elements in the column permutation matrix column by column is an intra-sequence-interleaved bit sequence.

The intra-sequence-interleaved bit sequence may be represented as $V=v_0, v_1, \ldots, v_{R_{subblock}^{LDPC} \times C_{subblock}^{LDCP}-1}$, where $v_0 = y_{P(0)+C_{subblock}^{LDPC}}$, $v_k = y_{\pi(k)}, \ldots$; and $$\pi(k) = \left[ P\left( \left\lfloor \frac{k}{R_{subblock}^{LDPC}} \right\rfloor \right) + C_{subblock}^{LDPC} \times (k \bmod R_{subblock}^{LDPC}) + 1 \right]$$

$$\bmod(R_{subblock}^{LDPC} \times C_{subblock}^{LDPC}).$$

An interleaved bit sequence $W=w_0, w_1, \ldots, w_E$ is obtained one by one from the intra-sequence-interleaved bit sequence. If a formula $v_i \neq$ <NULL> is satisfied, and a minimum value of i is $i_0$, $w_0=w_{i_0}$. If $w_p=v_{i_q}$, a formula $v_i \neq$ <NULL>, $i>i_q$ is satisfied, and a minimum value of i is $i_{q+1}$, $w_{p+1}$, $w_{p+1}=v_{i_{q+1}}$. It should be noted herein that before-interleaving matrices used to perform intra-sequence interleaving on different output bit sequences may be the same or different.

In another implementation of a data processing method in this application, if code blocks are grouped during code block segmentation for a transport block, output bit sequences corresponding to code blocks in at least one code block group may be concatenated to obtain an interleaved input bit sequence, for example, an input bit sequence A, and then intra-sequence interleaving is performed on the input bit sequence A. Step 103 to step 105 are separately performed on code blocks in a code block group, or step 103, step 106, step 107, and step 105 are separately performed on code blocks in a code block group, to obtain corresponding output bit sequences. These output bit sequences may also be referred to as a group of output bit sequences. In other words, each output bit sequence is obtained from a circular buffer. The circular buffer is configured to store all or some bits obtained by encoding a code block corresponding to each output bit sequence, or the circular buffer is configured to store all or some bits obtained by performing encoding and bit reordering on a code block corresponding to each output bit sequence.

A possible embodiment may include the following:

A01. Obtain an input bit sequence A, where the input bit sequence A may be obtained based on at least one group of output bit sequences, each group of output bit sequences includes at least one output bit sequence, and each output bit sequence in each group of output bit sequences is generated based on code blocks in a same code block group.

A02. Interleave the input bit sequence A.

For a method for performing intra-sequence interleaving on the input bit sequence A, refer to step 301 to step 305. A difference lies in that E is a length of the input bit sequence A.

For example, after code block segmentation is performed on a transport block, a total of 15 code blocks and 3 code block groups are obtained. Code blocks 0 to 4 belong to a code block group 0, code blocks 5 to 9 belong to a code block group 1, and code blocks 10 to 14 belong to a code block group 2. If intra-sequence interleaving is performed on the code block group 0, the input bit sequence A may be obtained by concatenating output bit sequences corresponding to the code blocks in the code block group 0, to be specific, obtained by concatenating output bit sequences corresponding to the code blocks 0 to 4. If intra-sequence interleaving is performed on a plurality of code block groups, for example, the code block groups 1 and 2, the input bit sequence A may be obtained by concatenating output bit sequences corresponding to the code blocks in the code block groups 1 and 2, to be specific, obtained by concatenating output bit sequences corresponding to the code blocks 5 to 14. It should be noted that only an example is used for description herein, and this is not limited in this embodiment of the present invention.

The following describes a process of performing frequency-domain interleaving on two or more output bit sequences.

Figure 4:
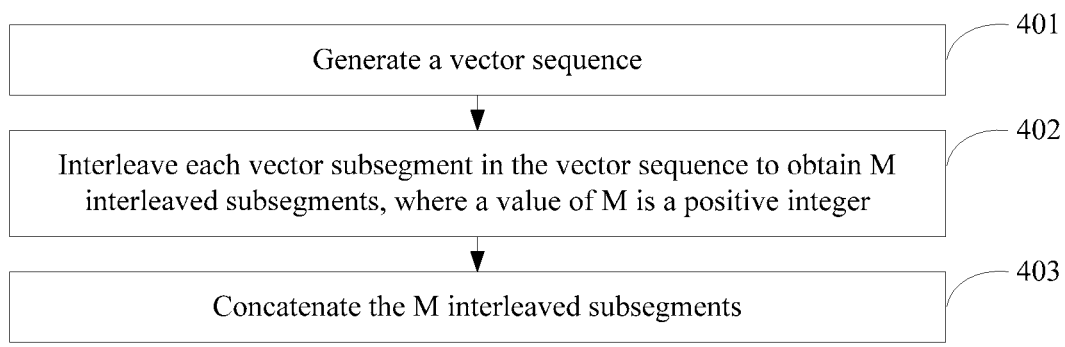
FIG. 4 is a schematic flowchart of another embodiment of a data processing method according to this application.

FIG. 4 is a schematic flowchart of another embodiment of an interleaving method according to this application.

Step 401: Generate a vector sequence.

The vector sequence includes at least one vector, and the vector sequence includes at least a vector generated based on the first output bit sequence. Q vectors are generated based on the first output bit sequence, where Q is a positive integer.

Each vector generated based on the first output bit sequence includes at least one bit of the first output bit sequence, and bits included in the vectors may not overlap with each other. Each vector may include a predetermined quantity of bits, and the quantity of bits included in the vector may be a product $Q_m \cdot N_L$ of a modulation order $Q_m$ and a quantity $N_L$ of mapping layers.

It should be noted that, in this embodiment of this application, the vector sequence is also referred to as a vector segment, a vector subsequence is usually a subset of the vector sequence, and the vector subsequence is also referred to as a vector subsegment. The vector sequence, the vector segment, the vector subsequence, and the vector subsegment each include one or more vectors in form. Each vector includes one or more bits. The vector sequence, the vector segment, the vector subsequence, and the vector subsegment are all interleaved at a granularity of a vector.

For example, if the first output bit sequence includes 16 bits and each vector includes four bits, four vectors are generated based on the first output bit sequence, each vector includes four bits of the first output bit sequence, and the first output bit sequence is obtained by combining the bits included in the vectors.

In addition to a vector generated based on the first output bit sequence, if a value of N is greater than 1, the vector sequence may further include a vector generated based on a second output bit sequence. Each vector of the second output bit sequence includes at least one bit of the second output bit sequence.

The data processing device may first obtain a second to-be-processed bit sequence. When the first to-be-processed sequence is a transport block, the second to-be-processed bit sequence may be a transport block different from the first to-be-processed sequence; or when the first to-be-processed sequence is one of the N bit sequences, the second transmission bit sequence may be another bit sequence, different from the first to-be-processed sequence, in the N bit sequences.

After obtaining the second to-be-processed bit, the data processing device may encode the second to-be-processed bit sequence to obtain a second encoded bit sequence, then store all or at least some bits of the second encoded bit sequence into a circular buffer, and output the second output bit sequence from the circular buffer. A process of generating the second output bit sequence is similar to a process of generating the first output bit sequence. Details are not described herein again.

It should be noted herein that there may be one or more second output bit sequences. Generally, there may be N−1 second output bit sequences, and each second output bit sequence may correspond to a to-be-processed bit sequence other than the first to-be-processed bit sequence. A manner of generating a vector based on the second output bit sequence is the same as a manner of generating a vector based on the first bit sequence. Details are not described herein again.

In addition, when the transport block is downlink data, the vector sequence may include only vectors generated based on N output bit sequences. When the transport block is uplink data, the vector sequence may further include a vector generated based on information that needs to be included in channel associated signaling.

For example, the vectors generated based on the N output bit sequences may be represented as a first vector subsequence $g_0, g_1, \ldots, g_{H'-1}$, where H' represents a total quantity of vectors generated based on the N output bit sequences. If channel associated signaling that needs to be sent in a preset manner includes a total of $Q'_{Ad}$ vectors, the channel associated signaling may be represented as a second vector subsequence $q_0^{Ad}, q_1^{Ad}, q_2^{Ad}, \ldots, q_{Q'_{Ad}-1}^{Ad}$. The data processing device may interleave $g_0, g_1, \ldots, g_{H'1}$ and $q_0^{Ad}, q_1^{Ad}, q_2^{Ad}, \ldots, q_{Q'_{Ad}-1}^{Ad}$, to obtain a vector sequence $g'_0, g'_1, \ldots, g'_{H'_{total}-1}$. A length of the vector sequence is $H'_{total}=H'+Q'_{Ad}$.

Step 402: Interleave each vector subsequence in the vector sequence to obtain M interleaved subsequences, where a value of M is a positive integer.

The vector sequence includes M vector subsegments. A quantity of vectors included in each vector subsegment is a positive integer multiple of a quantity of vectors corresponding to one time domain symbol on a channel used to transmit the transport block. The time domain symbol may be an OFDM symbol or an SC-FDMA symbol, or a time domain symbol in another multiple access manner. The data processing device may interleave each vector subsequence in the vector sequence, to obtain the M interleaved subsequences.

The following uses one vector subsequence as an example to describe a frequency-domain interleaving process.

The data processing device may first determine a before-frequency-domain-interleaving matrix. The before-frequency-domain-interleaving matrix has $C_{fre}^{LDPC}$ columns and $R_{fre}^{LDPC}$ rows, $Q_{symb}^{LDPC} \leq R_{fra}^{LDPC} \times C_{fre}^{LDPC}$, and $Q_{symb}^{LDPC}$ is a length of the vector subsequence. In this embodiment, each vector subsegment includes only vector(s) included corresponding to one time domain symbol. $N_{symb}$ is a quantity $Q_{symb}^{LDPC}=H'_{total}/N_{symb}$ of time domain symbols on a channel used to transmit the transport block within one subframe. Generally, $C_{fre}^{LDPC}$ may be a predetermined value, and $R_{fre}^{LDPC}$ may be a minimum value that meets $Q_{symb}^{LDPC} \leq R_{fre}^{LDPC} \times C_{fre}^{LDPC}$. Columns in the before-frequency-domain-interleaving matrix are sequentially numbered $0, 1, 2, \ldots, C_{fre}^{LDPC}-1$ from left to right, and rows in the before-frequency-domain-interleaving matrix are sequentially numbered $0, 1, 2, \ldots, R_{fre}^{LDPC}-1$ from top to bottom.

If $Q_{symb}^{LDPC} < R_{fre}^{LDPC} \times C_{fre}^{LDPC}$, $N_D = R_{fre}^{LDPC} \times C_{fre}^{LDPC} - Q_{symb}^{LDPC}$ filling symbols are inserted into a starting position of the vector subsequence $Y_2 = e_0, e_1, \ldots, e_{E-1}$, to obtain a filled symbol sequence $Y'_2 = y_0, y_1, \ldots, y_{R_{fre}^{LDPC} \times C_{fre}^{LDPC}-1}$. When $k=0, 1, \ldots, N_D$, a vector is $y_k = <NULL>$; and when $k=0, 1, \ldots, E$, $y_{N_D+K} = e_k$.

After generating the filled symbol sequence $Y'_2$, the data processing device may fill $Y'_2$ to the before-column-permutation matrix in a row-by-row filling manner, where each symbol in $Y'_2$ occupies one element position in the before-column-permutation matrix; then perform column permutation on the before-column-permutation matrix according to a preset column permutation pattern, to generate an after-column-permutation matrix, where the before-column-permutation matrix and the after-column-permutation matrix herein are described relative to the column permutation, and it can be learned that the before-column-permutation matrix is the before-frequency-domain-interleaving matrix; and sequentially read all matrix elements in the after-column-permutation matrix column by column. A sequence obtained by sequentially reading all the matrix elements in the after-column-permutation matrix column by column is an after-frequency-domain-interleaving vector sequence.

After the symbol sequence is padded to the before-frequency-domain-interleaving matrix row by row, the following matrix may be obtained:

$$\begin{bmatrix} y_0 & y_1 & y_2 & \cdots & y_{C_{fre}^{LDPC}-1} \\ y_{C_{fre}^{LDPC}} & y_{C_{fre}^{LDPC}+1} & y_{C_{fre}^{LDPC}+2} & \cdots & y_{2 \cdot C_{fre}^{LDPC}-1} \\ \vdots & \vdots & \vdots & \ddots & \vdots \\ y_{(R_{fre}^{LDPC}-1) \times C_{fre}^{LDPC}} & y_{(R_{fre}^{LDPC}-1) \times C_{fre}^{LDPC}+1} & y_{(R_{fre}^{LDPC}-1) \times C_{fre}^{LDPC}+2} & \cdots & y_{(R_{fre}^{LDPC} \times C_{fre}^{LDPC}-1)} \end{bmatrix}$$

The data processing device may perform column permutation on the before-frequency-domain-interleaving matrix according to a preset interleaving pattern to obtain an after-frequency-domain-interleaving matrix. The interleaving pattern may be represented as $\langle p(j) \rangle_{j \in \{0, 1, \ldots, N-1\}}$, where p(j) is an original column number of a column j after the column permutation. The after-frequency-domain-interleaving matrix is represented as follows:

$$\begin{bmatrix} y_{p(0)} & y_{p(1)} & y_{p(2)} & \cdots & y_{p(C_{fre}^{LDPC}-1)} \\ y_{p(0)+C_{fre}^{LDPC}} & y_{p(1)+C_{fre}^{LDPC}+1} & y_{p(2)+C_{fre}^{LDPC}+2} & \cdots & y_{p(C_{fre}^{LDPC}-1)+2 \cdot C_{fre}^{LDPC}-1} \\ \vdots & \vdots & \vdots & \ddots & \vdots \\ y_{p(0)+(R_{fre}^{LDPC}-1) \times C_{fre}^{LDPC}} & y_{p(1)+(R_{fre}^{LDPC}-1) \times C_{fre}^{LDPC}+1} & y_{p(2)+(R_{fre}^{LDPC}-1) \times C_{fre}^{LDPC}+2} & \cdots & y_{p(C_{fre}^{LDPC}-1)+(R_{fre}^{LDPC} \times C_{fre}^{LDPC}-1)} \end{bmatrix}$$

The data processing device may read matrix elements in the after-frequency-domain-interleaving matrix column by column to obtain the after-frequency-domain-interleaving vector sequence. The after-frequency-domain-interleaving vector sequence includes $R_{fre}^{LDPC} \times C_{fre}^{LDPC}-1$ symbols, and the after-frequency-domain-interleaving vector sequence may be represented as $v_0, v_1, \ldots, v_{R_{fre}^{LDPC} \times C_{fre}^{LDPC}-1}$, where $v_0 = y_{p(0)}$, $c_1 = y_{p(0)+C_{fre}^{LDPC}}, \ldots$ In other words, $v_k = y_{\pi(k)}$, and $$\pi(k) = \left[ P\left( \left\lfloor \frac{k}{R_{fre}^{LDPC}} \right\rfloor \right) + C_{fre}^{LDPC} \times (k \bmod R_{fre}^{LDPC}) + 1 \right] \bmod (R_{fre}^{LDPC} \times C_{fre}^{LDPC}).$$

An interleaved vector sequence $W = w_0, w_1, \ldots, w_E$ is obtained one by one from an intra-sequence-interleaved vector sequence. If a formula $v_i \neq <NULL>$ is satisfied, and a minimum value of i is $i_0$, $w_0 = v_{i_0}$. If $w_p = v_{i_q}$, a formula $v_i \neq <NULL>$, $i > i_q$ is satisfied, and a minimum value of i is $i_{q+1}$, $w_{p+1} = v_{i_{q+1}}$.

After intra-vector-subsequence interleaving is completed, an interleaved subsequence may be mapped for sending. Alternatively, vector subsequences may be first interleaved and concatenated, and then mapped for sending.

Optionally, the following step may be further included:

Step 403: Concatenate the M interleaved subsequences.

After the interleaved subsequences corresponding to the M vector subsequences are all generated, the data processing device may concatenate the M interleaved subsequences, to complete frequency-domain interleaving of an output sequence, and obtain an interleaved sequence.

After generating the vector sequence, the data processing device may interleave the vector sequence in a channel interleaving manner. As shown in the figure, step 402 and step 403 may be replaced with step 404.

Figure 5:
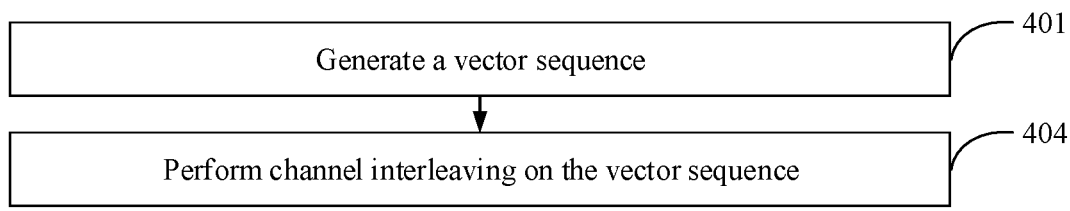
FIG. 5 is a schematic flowchart of another embodiment of a data processing method according to this application.

FIG. 5 is a schematic flowchart of another embodiment of an interleaving method according to this application.

Step 404: Perform channel interleaving on the vector sequence.

The data processing device first obtains a before-channel-interleaving matrix with $C_{max}^{LDPC}$ columns, where $C_{max}^{LDPC}$ is a positive integer greater than 1. The before-channel-interleaving matrix has $R_{max}^{LDPC} = (H'_{total} \cdot Q_m \cdot N_L)/C_{max}^{LDPC}$ rows denoted by bit, or has $R'_{max}^{LDPC} = R_{max}^{LDPC}/(Q_m \cdot N_L)$ rows denoted by symbol. Columns in the before-channel-interleaving matrix are sequentially numbered $0, 1, 2, \ldots, C_{max}^{LDPC}-1$ from left to right, and rows in the before-channel-interleaving matrix are sequentially numbered $0, 1, 2, \ldots, R_{max}^{LDPC}-1$ from top to bottom.

A value of $C_{max}^{LDPC}$ is equal to $N_{symb}^{PUSCH}$, and $N_{symb}^{PUSCH}$ indicates a quantity of SC-FDMA symbols in each subframe on an uplink data channel. In a wireless communications system, SC-FDMA may not be used, and channel interleaving may also be used on a downlink. Therefore, a specific value of $C_{max}^{LDPC}$ is not limited in this application.

If channel interleaving is applied to an uplink and MIMO rank information (rank information) also needs to be sent, a MIMO rank information symbol sequence may be represented as $q_0^{RI}, q_1^{RI}, q_2^{RI}, \ldots, q_{Q'_{RI}-1}^{RI}$, and $q_0^{RI}, q_1^{RI}, q_2^{RI}, \ldots, q_{Q'_{RI}-1}^{RI}$ is written into a specified column one by one and row by row upwards starting from the last row of the matrix. The specified column described herein may be a column indicated in Table 5.2.2.8-1 in an LTE protocol TS 36.212.

After the MIMO rank information symbol sequence is written into the before-channel-interleaving matrix, the data processing device may write, starting from the upper left corner of the matrix, symbols corresponding to an information symbol sequence $g_0, g_1, \ldots, g_{H'-1}$ into the matrix.

After the information symbol sequence is inserted into the before-channel-interleaving matrix row by row, the following matrix may be obtained:

$$\begin{bmatrix} y_0 & y_1 & y_2 & \cdots & y_{C_{max}^{LDPC}-1} \\ y_{C_{max}^{LDPC}} & y_{C_{max}^{LDPC}+1} & y_{C_{max}^{LDPC}+2} & \cdots & y_{2 \cdot C_{max}^{LDPC}-1} \\ \vdots & \vdots & \vdots & \ddots & \vdots \\ y_{(R'_{max}^{LDPC}-1) \times C_{max}^{LDPC}} & y_{(R'_{max}^{LDPC}-1) \times C_{fre}^{LDPC}+1} & y_{(R'_{max}^{LDPC}-1) \times C_{max}^{LDPC}+2} & \cdots & y_{(R'_{max}^{LDPC} \times C_{max}^{LDPC}-1)} \end{bmatrix}$$

Starting from $y_0$, each element in the matrix indicates one symbol, and a symbol that has already been formerly written is directly skipped.

If channel interleaving is applied to an uplink and HARQ-ACK information also needs to be sent in a subframe, a to-be-sent HARQ-ACK information symbol sequence may be represented as $q_0^{ACK}, q_1^{ACK}, q_2^{ACK}, \ldots, q_{Q_{ACK}-1}^{ACK}$. The data processing device may write the HARQ-ACK information symbol sequence into a specified column one by one and row by row upwards starting from the last row of the matrix. In this step, some symbols in the information symbol sequence that have already been written into the before-channel-interleaving matrix are re-written. The specified column may be a column indicated in Table 5.2.2.8-2 in the LTE protocol TS 36.212.

The data processing device may perform bit reordering on the before-channel-interleaving matrix according to a preset interleaving pattern to obtain an after-channel-interleaving matrix. Then, the data processing device sequentially reads symbols in the after-channel-interleaving matrix column by column. A symbol sequence obtained through channel interleaving is represented as $h_0, h_1, \ldots, h_{H+N_L \cdot Q_{RI}-1}$. $N_L$ herein indicates a quantity of layers corresponding to a corresponding transport block.

In another implementation of an interleaving method in this application, if code blocks are grouped during code block segmentation for a transport block, interleaving may be performed based on one or more code block groups after a vector sequence is generated. For an implementation method, refer to step 401 to step 403. A difference lies in that each vector subsequence includes a vector that is generated based on an output bit sequence corresponding to each code block in at least one code block group.

For example, after code block segmentation is performed on a transport block, a total of 5 code blocks and 2 code block groups are obtained. Code blocks 0 to 2 belong to a code block group 0, and code blocks 3 and 4 belong to a code block group 1. If each vector includes four bits, and a length of an output bit sequence corresponding to each code block is 16 bits, four vectors $g_0, g_1, g_2$, and $g_3$ may be generated based on an output bit sequence corresponding to the code block 0, four vectors $g_4$ to $g_7$ may be generated based on an output bit sequence corresponding to the code block 1, four vectors $g_8$ to $g_{11}$ may be generated based on an output bit sequence corresponding to the code block 2, four vectors $g_{12}$ to $g_{15}$ may be generated based on an output bit sequence corresponding to the code block 3, and four vectors $g_{16}$ to $g_{19}$ may be generated based on an output bit sequence corresponding to the code block 4. In a possible implementation, if interleaving may be performed based on one code block group, the vector sequence may include two vector subsequences. Each vector subsequence includes a vector that is generated based on an output bit sequence corresponding to each code block in a code block group. A vector subsequence A includes vectors $g_0$ to $g_{11}$ with a length 12 that are generated based on output bit sequences corresponding to the code blocks 0 to 2 in the code block group 0. A vector subsequence B includes vectors $g_{12}$ to $g_{19}$ with a length 8 that are generated based on output bit sequences corresponding to the code blocks 3 and 4 in the code block group 1. Certainly, interleaving may be alternatively performed based on a plurality of code block groups. The vector sequence includes one vector subsequence, and the vector subsequence includes vectors $g_0$ to $g_{19}$ that are generated based on output bit sequences corresponding to the code blocks in the two code block groups. It should be noted that only an example is used for ease of description herein, and this is not limited in this embodiment of the present invention.

A possible implementation of a data processing method provided in this application may include the following steps:

B01. Obtain Q vectors based on P output bit sequences.

B02. Obtain an input vector sequence A, where the input vector sequence A includes Q vectors, and the Q vectors are obtained based on the P output bit sequences in the previous step.

B03. Interleave the input vector sequence A.

Both P and Q are integers greater than 0.

Frequency-domain interleaving, channel interleaving, and code block group interleaving are all interleaving performed on a vector subsequence at a granularity of a vector. If the vector subsequence is referred to as an input vector sequence A, the input vector sequence A includes Q vectors, and the Q vectors are obtained based on P output bit sequences.

Each output bit sequence is obtained from a circular buffer. The circular buffer is configured to store all or some bits obtained by encoding a code block corresponding to each output bit sequence, or the circular buffer is configured to store all or some bits obtained by performing encoding and bit reordering on a code block corresponding to each output bit sequence. For example, each output bit sequence may be obtained by separately performing step 103 to step 105 or performing step 103, step 106, step 107, and step 105 on each code block obtained by performing segmentation on a transport block.

The obtaining Q vectors based on P output bit sequences may be: dividing each output bit sequence into at least one vector, and generating the Q vectors based on the P output bit sequences; or separately performing intra-sequence interleaving on the P output bit sequences to obtain P interleaved bit sequences, and dividing each interleaved bit sequence into at least one vector to obtain the Q vectors. For a method for performing intra-sequence interleaving on each output bit sequence, refer to step 301 to step 305 or A01 and A02 in the foregoing method.

It can be learned that for the frequency-domain interleaving, Q is a positive integer multiple of a quantity of vectors included in a time domain symbol on a channel used to transmit the transport block within one transmission time interval.

It can be learned that for the channel interleaving, P is a quantity of code blocks obtained by performing code block segmentation on the transport block.

It can be learned that for the code block group interleaving, P is a quantity of code blocks included in at least one of G code block groups that are obtained by performing code block segmentation on the transport block.

Figure 6:
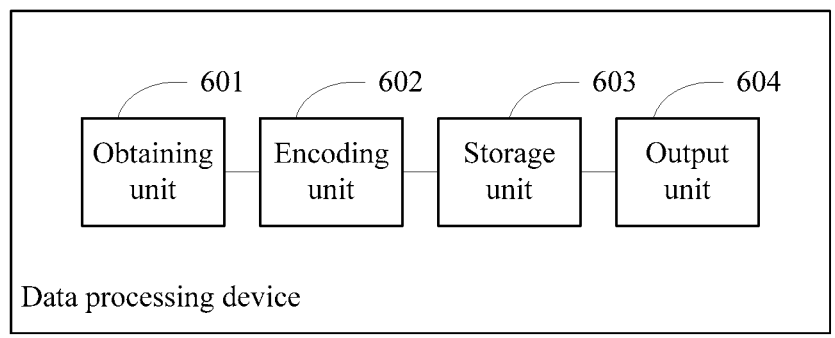
FIG. 6 is a schematic structural diagram of an embodiment of a data processing device according to this application.

FIG. 6 is a schematic structural diagram of an embodiment of a data processing device according to this application.

As shown in FIG. 6, the data processing device may include: an obtaining unit 601, configured to obtain a first to-be-processed bit sequence, where the first to-be-processed bit sequence is a transport block or a code block generated by performing code block segmentation on a transport block; an encoding unit 602, configured to encode the first to-be-processed bit sequence to obtain a first encoded bit sequence; a saving unit 603, configured to store all or at least some bits of the first encoded bit sequence into a circular buffer; and an output unit 604, configured to output a first output bit sequence from the circular buffer.

It can be learned that the circular buffer in the data processing device may be configured to store all or some bits of the first encoded bit sequence obtained by the encoding unit 602, so as to perform rate matching.

Optionally, the obtaining unit 601 includes: an obtaining subunit, configured to obtain the transport block; and a generation subunit, configured to generate, based on the transport block, N bit sequences that include the first to-be-processed bit sequence, where N is an integer greater than 1.

Optionally, a first interleaving unit is configured to interleave the first output bit sequence.

Optionally, a second interleaving unit is further included, and configured to: generate a vector sequence based on the first output bit sequence, where the vector sequence includes Q vectors of the first output bit sequence, each vector of the first output bit sequence includes at least one bit of the first output bit sequence, and Q is a positive integer; and interleave the vector sequence.

Optionally, the vector sequence further includes vectors generated based on a second output bit sequence, and each vector of the second output bit sequence includes at least one bit of the second output bit sequence.

Optionally, the second interleaving unit is specifically configured to interleave the vectors included in the vector sequence.

Optionally, the second interleaving unit is specifically configured to: perform intra-vector-subsequence interleaving on each vector subsequence included in the vector sequence to obtain M interleaved subsequences, where the vector sequence includes M vector subsequences, and a quantity of vectors included in each vector subsequence is a positive integer multiple of a quantity of vectors included in a time domain symbol on a channel used to transmit the transport block within one transmission time interval; and concatenate the M interleaved subsequences.

The data processing device may be configured to implement the foregoing method embodiments. For details, refer to descriptions in the foregoing method embodiments. Details are not described herein again.

Figure 7:
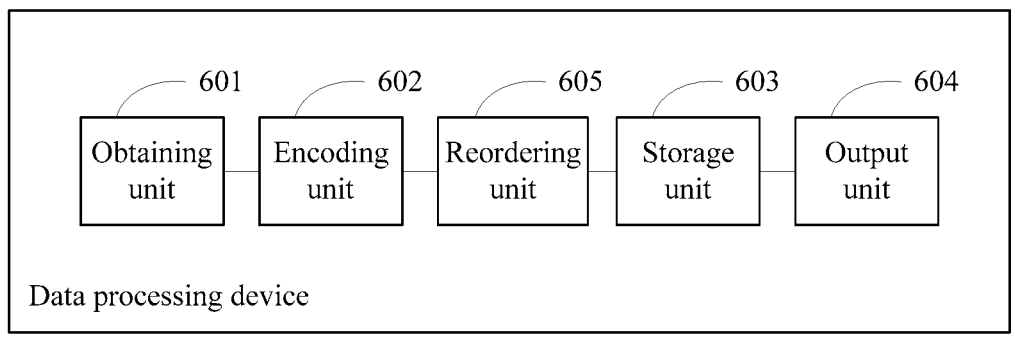
FIG. 7 is a schematic structural diagram of an embodiment of a data processing device according to this application.

In another implementation, as shown in FIG. 7, the data processing device may further include a reordering unit 605. When the reordering unit 605 is included, an obtaining unit 601 is configured to obtain a first to-be-processed bit sequence, where the first to-be-processed bit sequence is a transport block or a code block generated by performing code block segmentation on a transport block; an encoding unit 602 is configured to encode the first to-be-processed bit sequence to obtain a first encoded bit sequence; the reordering unit 605 is configured to perform bit reordering on the first encoded bit sequence to obtain a first reordered bit sequence; a saving unit 603 is configured to store all or at least some bits of the first reordered bit sequence into a circular buffer; and an output unit 604 is configured to output a first output bit sequence from the bits stored in the circular buffer.

Optionally, the reordering unit 605 is specifically configured to: change a position of a first subsequence in the first encoded bit sequence, where a length of the first subsequence is a positive integer multiple of a lifting factor; or delete a second subsequence in the first encoded bit sequence, where a length of the second subsequence is a positive integer multiple of a lifting factor. In other words, the first reordered bit sequence is obtained by changing the position of the first subsequence in the first encoded bit sequence, or the first reordered bit sequence is obtained by deleting the second subsequence in the first encoded bit sequence.

It can be learned that the circular buffer in the data processing device may also be configured to store all or some bits of the first reordered bit sequence obtained by the reordering unit 605, so as to perform rate matching.

Optionally, the second subsequence includes at least one information bit.

Optionally, the reordering unit 605 is specifically configured to: obtain a punctured sequence and a interleaved redundancy sequence, where the punctured sequence is a sequence obtained by puncturing an information bit sequence, the interleaved redundancy sequence is a sequence obtained by performing bit reordering on a first redundancy sequence; and concatenate the punctured sequence, the interleaved redundancy sequence, and a second redundancy sequence to obtain bits of the first reordered bit sequence, where the information bit sequence includes information bits included in the first to-be-processed bit sequence, the first redundancy sequence includes redundancy bits that are generated by encoding the first to-be-processed bit sequence by using a core matrix of an LDPC parity check matrix, and the second redundancy sequence includes redundancy bits that are generated by encoding the first to-be-processed bit sequence by using a spread matrix of the LDPC parity check matrix.

Optionally, the reordering unit 605 is further configured to reorder, according to a selected interleaving pattern, subsequences included in the first redundancy sequence, where each subsequence includes redundancy bits that are generated by encoding the information bit sequence by using a column for parity bits in the core matrix.

The data processing device may be configured to implement the foregoing method embodiments. For details, refer to descriptions in the foregoing method embodiments. Details are not described herein again.

A data processing device in another embodiment of this application may include:

an obtaining unit 601, configured to obtain a first to-be-processed bit sequence, where the first to-be-processed bit sequence is a transport block or a code block generated by performing code block segmentation on a transport block;

an encoding unit 602, configured to encode the first to-be-processed bit sequence to obtain a first encoded bit sequence; and an output unit 604, configured to output a first output bit sequence from a circular buffer.

The circular buffer is configured to store all or some bits of the first encoded bit sequence, or the circular buffer is configured to store all or some bits of a first reordered bit sequence, and the first reordered bit sequence is obtained by performing bit reordering on the first encoded bit sequence.

Optionally, a first interleaving unit is further included, and configured to interleave the first output bit sequence.

Optionally, a second interleaving unit is further included, and configured to: generate a vector sequence based on the first output bit sequence, where the vector sequence includes Q vectors of the first output bit sequence, each vector of the first output bit sequence includes at least one bit of the first output bit sequence, and Q is a positive integer; and interleave the vector sequence.

The data processing device may be configured to implement the foregoing method embodiments. For details, refer to descriptions in the foregoing method embodiments. Details are not described herein again.

In another embodiment of this application, a data processing device may be configured to implement the method in the foregoing method embodiments. For details, refer to descriptions in the foregoing method embodiments. Details are not described herein again. The data processing device may include:

an obtaining unit, configured to obtain an input bit sequence A, where the input bit sequence A is obtained based on at least one group of output bit sequences, each group of output bit sequences includes at least one output bit sequence, and each output bit sequence in each group of output bit sequences is generated based on code blocks in a same code block group; and an interleaving unit, configured to interleave the input bit sequence A.

In another embodiment of this application, a data processing device may be configured to implement the method in the foregoing method embodiments. For details, refer to descriptions in the foregoing method embodiments. Details are not described herein again. The data processing device may include:

a generation unit, configured to obtain M vectors based on N output bit sequences;

an obtaining unit, configured to obtain an input vector sequence A, where the input vector sequence A includes the M vectors; and an interleaving unit, configured to interleave the input vector sequence A.

N is an integer greater than 0, M is an integer greater than 0, and each output bit sequence corresponds to a code block obtained by performing code block segmentation on a transport block.

Figure 8:
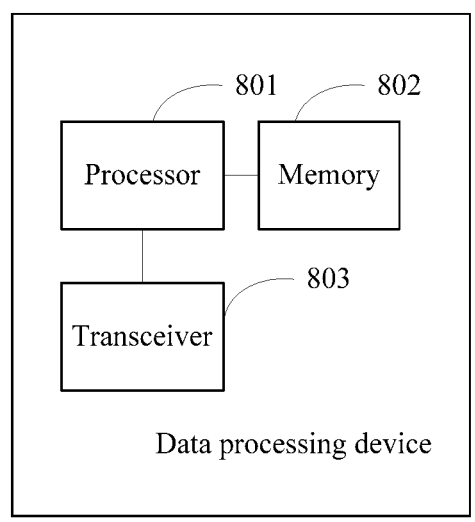
FIG. 8 is a schematic structural diagram of an embodiment of a data processing device according to this application.

FIG. 8 is a schematic structural diagram of another embodiment of a data processing device according to this application. As shown in FIG. 8, the data processing device may include a processor 801, a memory 802, and a transceiver 803.

The transceiver 803 is configured to obtain a first to-be-processed bit sequence, where the first to-be-processed bit sequence is a transport block or a code block generated by performing code block segmentation on a transport block. The processor 801 is configured to: encode the first to-be-processed bit sequence to obtain a first encoded bit sequence; store all or at least some bits of the first encoded bit sequence into a circular buffer; and output a first output bit sequence from the bits stored in the circular buffer. The transceiver 803 may be further configured to output the first output bit sequence.

Optionally, the transceiver 803 may be further configured to obtain the transport block; and the processor 801 may be further configured to generate, based on the transport block, N bit sequences that include the first to-be-processed bit sequence, where N is an integer greater than 1.

Optionally, the processor 801 may be further configured to interleave the first output bit sequence.

Optionally, the processor 801 may be further configured to: generate a vector sequence based on the first output bit sequence, where the vector sequence includes Q vectors of the first output bit sequence, each vector of the first output bit sequence includes at least one bit of the first output bit sequence, and Q is a positive integer; and interleave the vector sequence.

Optionally, the processor 801 may be further configured to interleave the vectors included in the vector sequence.

Optionally, the processor 801 may be further configured to: perform intra-vector-subsequence interleaving on each vector subsequence included in the vector sequence to obtain M interleaved subsequences, where the vector sequence includes M vector subsequences, and a quantity of vectors included in each vector subsequence is a positive integer multiple of a quantity of vectors included in a time domain symbol on a channel used to transmit the transport block within one transmission time interval; and concatenate the M interleaved subsequences.

Optionally, the transceiver 803 may be further configured to obtain a first to-be-processed bit sequence, where the first to-be-processed bit sequence is a transport block or a code block generated by performing code block segmentation on a transport block. The processor 801 may be further configured to: encode the first to-be-processed bit sequence to obtain a first encoded bit sequence; perform bit reordering on the first encoded bit sequence to obtain a first reordered bit sequence; store all or at least some bits of the first reordered bit sequence into a circular buffer; and output a first output bit sequence from the bits stored in the circular buffer.

The performing bit reordering on the first encoded bit sequence includes at least one of the following operations: changing a position of a first subsequence in the first encoded bit sequence, where a length of the first subsequence is a positive integer multiple of a lifting factor; or deleting a second subsequence in the first encoded bit sequence, where a length of the second subsequence is a positive integer multiple of a lifting factor. The second subsequence includes at least one information bit.

The processor 801 may be further configured to: obtain a punctured sequence and a interleaved redundancy sequence, where the punctured sequence is a sequence obtained by puncturing an information bit sequence, and the interleaved redundancy sequence is a sequence obtained by performing bit reordering on a first redundancy sequence; and concatenate the punctured sequence, the interleaved redundancy sequence, and a second redundancy sequence to obtain bits of the first reordered bit sequence, where the information bit sequence includes information bits included in the first to-be-processed bit sequence, the first redundancy sequence includes redundancy bits that are generated by encoding the first to-be-processed bit sequence by using a core matrix of an LDPC parity check matrix, and the second redundancy sequence includes redundancy bits that are generated by encoding the first to-be-processed bit sequence by using a spread matrix of the LDPC parity check matrix.

The processor 801 may be further configured to reorder, according to a selected interleaving pattern, subsequences included in the first redundancy sequence, where each subsequence includes redundancy bits that are generated by encoding the information bit sequence by using a column for parity bits in the core matrix.

It should be noted that the data processing device may include one or more memories and one or more processors. The memory stores an instruction. The processor is coupled to the memory and configured to invoke the instruction in the memory to perform the steps described in the foregoing method embodiments.

Figure 9:
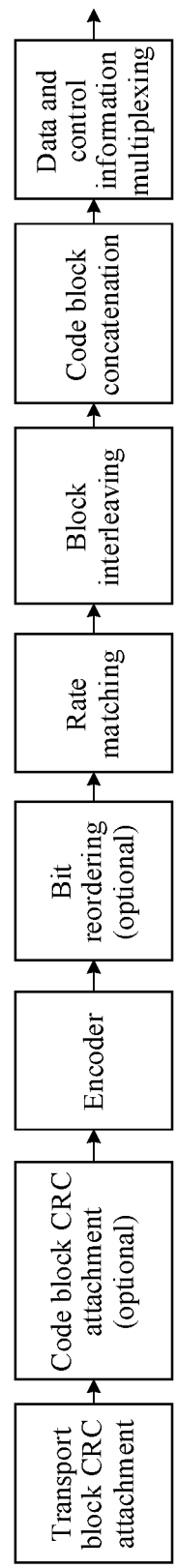
FIG. 9 is a schematic architectural diagram of a data processing system on an uplink transmit side according to this application.

FIG. 9 is a schematic architectural diagram of a data processing system on an uplink transmit side according to this application.

As shown in FIG. 9, the system may include the following modules: A transport block CRC attachment (transport block CRC attachment) module is configured to perform CRC attachment on a transport block. A code block CRC attachment (code block segmentation code block CRC attachment) module is configured to perform CRC attachment on a code block, where the code block may be generated by performing code block segmentation on the transport block. An encoding (encoder) module is configured to encode the code block, for example, may be configured to implement the encoding step in the foregoing embodiments. A bit reordering (bit re-ordering) module is configured to perform bit reordering on a sequence output by the encoding module, for example, may implement the step of performing bit reordering on an encoded bit sequence in the foregoing embodiments. A rate matching (rate matching) module is configured to implement a rate matching process in the foregoing embodiments, for example, may be configured to implement the steps of storing all or at least some bits of the encoded bit sequence into a circular buffer and outputting an output bit sequence from the bits stored in the circular buffer in the foregoing embodiments. A block interleaving (block interleaver) module is configured to interleave a bit sequence obtained through rate matching, for example, may be configured to implement the step of interleaving the output bit sequence in the foregoing embodiments. A code block concatenation (code block concatenation) module is configured to concatenate output bit sequences corresponding to code blocks, for example, may concatenate output bit sequences such as the first output bit sequence and the second output bit sequence in the foregoing embodiments. A data and control information multiplexing (data and control multiplexing) module is configured to add data information or control information to a sequence that is output through code block concatenation. The code block CRC attachment module and a column permutation module are optional modules, and the system may not include the code block CRC attachment module or may not include the column permutation module.

Figure 10:
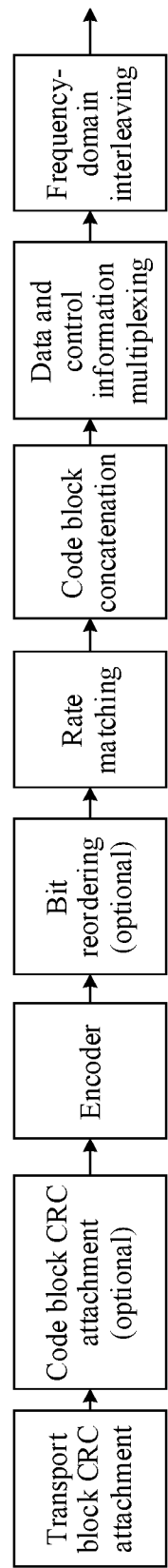
FIG. 10 is another schematic architectural diagram of a data processing system on an uplink transmit side according to this application.
Figure 11:
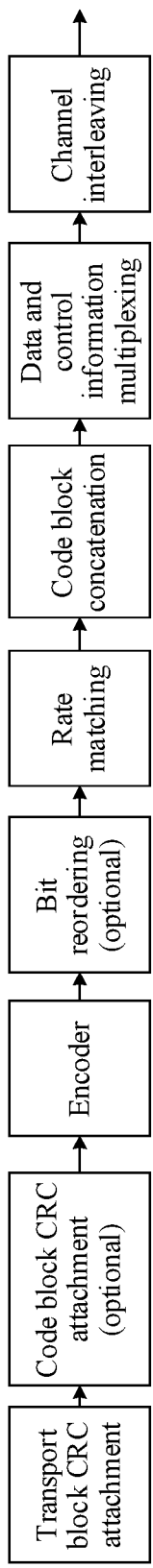
FIG. 11 is another schematic architectural diagram of a data processing system on an uplink transmit side according to this application.

In another implementation, the sub-block interleaving module, the code block concatenation module, and the data and control information multiplexing module may be replaced with a code block concatenation module, a data and control information multiplexing module, and a frequency-domain interleaving module that are shown in FIG. 10. In still another implementation, the block interleaving module, the code block concatenation module, and the data and control information multiplexing module may be replaced with a code block concatenation module, a data and control information multiplexing module, and a channel interleaving module that are shown in FIG. 11. In the two implementations, the code block concatenation module may be configured to concatenate bit sequences that are output by the rate matching module, for example, may implement the step of generating a vector sequence. The data and control information multiplexing module may implement a step of adding channel associated signaling to the vector sequence. The frequency-domain interleaving module may be configured to perform frequency-domain interleaving on a sequence that is output by the code block concatenation module, for example, implement the step of interleaving the vector sequence in the foregoing embodiments. The channel interleaving module may be configured to perform frequency-domain interleaving on the sequence that is output by the code block concatenation module, for example, implement the step of interleaving the vector sequence in the foregoing embodiments.

Figure 12:
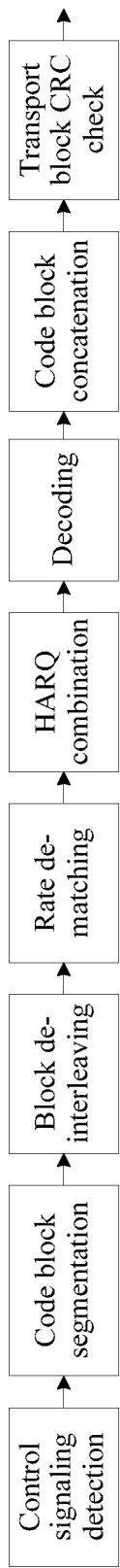
FIG. 12 is a schematic architectural diagram of a data processing system on an uplink receive side according to this application.

Correspondingly, an architecture of a data processing system on an uplink receive side may be shown in FIG. 12.

As shown in FIG. 12, the system may include a control signaling detection (control signaling detection) module, a code block segmentation (code block segmentation) module, a block de-interleaving (de-block interleaver) module, a rate de-matching (de-rate matching) module, a HARQ combination (HARQ combine) module, a decoding (decoder) module, a code block concatenation (code block concatenation) module, and a transport block CRC check (TB CRC calculation) module.

Figure 13:
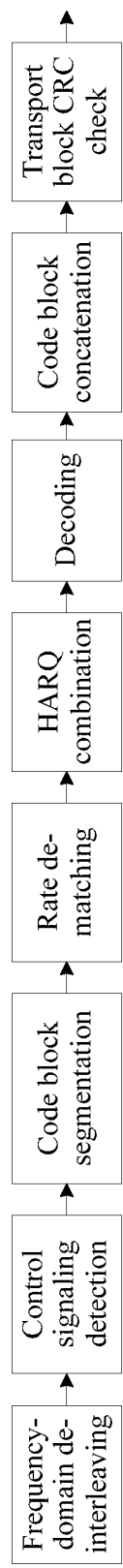
FIG. 13 is another schematic architectural diagram of a data processing system on an uplink receive side according to this application.
Figure 14:
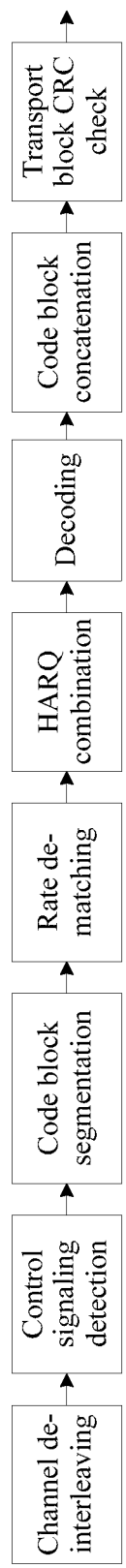
FIG. 14 is another schematic architectural diagram of a data processing system on an uplink receive side according to this application.

Alternatively, the control information detection module, the code block combination module, and the block de-interleaving module may be replaced with a frequency-domain de-interleaving module, a control information detection module, and a code block segmentation module that are shown in FIG. 13, or replaced with a frequency-domain de-interleaving module, a control information detection module, and a code block segmentation module that are shown in FIG. 14.

The foregoing modules each are configured to perform inverse processing of a corresponding module in the data processing system on the transmit side, and specific content is not described herein again.

Figure 15:
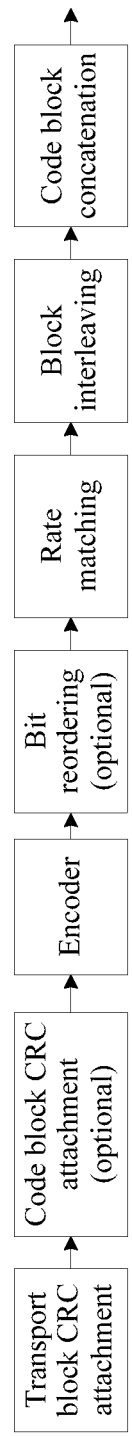
FIG. 15 is a schematic architectural diagram of a data processing system on a downlink transmit side according to this application.
Figure 16:
FIG. 16 is another schematic architectural diagram of a data processing system on a downlink transmit side according to this application.
Figure 17:
FIG. 17 is another schematic architectural diagram of a data processing system on a downlink transmit side according to this application.

FIG. 15 to FIG. 17 each are a schematic architectural diagram of a data processing system on a downlink transmit side according to this application.

An architecture of the data processing system on the downlink transmit side is similar to an architecture of the data processing system on the uplink transmit side. However, channel associated signaling does not need to be sent on a downlink, and therefore, the data processing system on the downlink transmit side may not include a data and control information multiplexing module.

Figure 18:
FIG. 18 is a schematic architectural diagram of a data processing system on a downlink receive side according to this application.
Figure 19:
FIG. 19 is another schematic architectural diagram of a data processing system on a downlink receive side according to this application.
Figure 20:
FIG. 20 is another schematic architectural diagram of a data processing system on a downlink receive side according to this application.

Correspondingly, FIG. 18 to FIG. 20 each are a schematic architectural diagram of a data processing system on a downlink receive side according to this application.

Channel associated signaling does not need to be sent on a downlink, and therefore, the data processing system on the downlink receive side may not include a control information detection module.

In a specific implementation, this application further provides a computer storage medium. The computer storage medium may store a program, and when the program is executed, some or all of the steps in the embodiments of the data processing method provided in this application may be performed. The storage medium may include: a magnetic disk, an optical disc, a read-only memory (ROM), or a random access memory (RAM), or the like.

A person skilled in the art may clearly understand that the technologies in the embodiments of this application may be implemented by software in addition to a necessary general hardware platform. Based on such an understanding, the technical solutions in the embodiments of this application essentially or the part contributing to the prior art may be implemented in a form of a software product. The computer software product may be stored in a storage medium such as a ROM/RAM, a magnetic disk, or an optical disc, and includes several instructions for instructing a computer device (which may be a personal computer, a server, a network device, or the like) to perform the methods described in the embodiments or some parts of the embodiments of this application.

Same or similar parts of the embodiments in this specification can be mutually referenced. Especially, the device embodiments are basically similar to the method embodiments, and therefore are described briefly. For related parts, refer to descriptions in the method embodiments.

The foregoing descriptions are implementations of this application, but are not intended to limit the protection scope of this application.

What is claimed is:

1. A data processing method, comprising:
    obtaining a first to-be-processed bit sequence, wherein the first to-be-processed bit sequence is a transport block or a code block generated by performing code block segmentation on a transport block;
    encoding the first to-be-processed bit sequence to obtain a first encoded bit sequence; and
    outputting a first output bit sequence from bits stored in a circular buffer, wherein
    the circular buffer is configured to store all or some bits of the first encoded bit sequence, or the circular buffer is configured to store all or some bits of a first reordered bit sequence that is obtained by performing bit reordering on the first encoded bit sequence, and a size of the circular buffer is determined based on a virtual buffer of a receiving device.

2. The method according to claim 1, wherein the first reordered bit sequence is obtained by changing a position of a first subsequence in the first encoded bit sequence, and a length of the first subsequence is a positive integer multiple of a lifting factor; or
    the first reordered bit sequence is obtained by deleting a second subsequence in the first encoded bit sequence, and a length of the second subsequence is a positive integer multiple of a lifting factor.

3. The method according to claim 1, wherein the obtaining a first to-be-processed bit sequence comprises:
    obtaining the transport block; and
    generating, based on the transport block, N bit sequences that comprise the first to-be-processed bit sequence, wherein N is an integer greater than 0.

4. The method according to claim 1, further comprising: interleaving the first output bit sequence.

5. The method according to claim 1, further comprising:
    generating a vector sequence based on the first output bit sequence, wherein the vector sequence comprises Q vectors of the first output bit sequence, each vector of the first output bit sequence comprises at least one bit of the first output bit sequence, and Q is a positive integer; and
    interleaving the vector sequence.

6. The method according to claim 5, wherein
    the vector sequence further comprises vectors generated based on a second output bit sequence, and each vector of the second output bit sequence comprises at least one bit of the second output bit sequence.

7. The method according to claim 5, wherein the interleaving the vector sequence comprises:
    interleaving the vectors comprised in the vector sequence.

8. The method according to claim 5, wherein the interleaving the vector sequence comprises:
    performing intra-vector-subsequence interleaving on each vector subsequence comprised in the vector sequence to obtain M interleaved subsequences, wherein the vector sequence comprises M vector subsequences, and a quantity of vectors comprised in each vector subsequence is a positive integer multiple of a quantity of vectors comprised in a time domain symbol on a channel used to transmit the transport block within one transmission time interval.

9. A data processing device, comprising:
    a processor; and
    a non-transitory computer-readable storage medium coupled to the processor and storing programming instructions for execution by the processor, the programming instructions instruct the processor to:
    obtain a first to-be-processed bit sequence, wherein the first to-be-processed bit sequence is a transport block or a code block generated by performing code block segmentation on a transport block;
    encode the first to-be-processed bit sequence to obtain a first encoded bit sequence; and
    output a first output bit sequence from a circular buffer, wherein
    the circular buffer is configured to store all or some bits of the first encoded bit sequence, or the circular buffer is configured to store all or some bits of a first reordered bit sequence that is obtained by performing bit reordering on the first encoded bit sequence, and a size of the circular buffer is determined based on a virtual buffer of a receiving device.

10. The data processing device according to claim 9, wherein the first reordered bit sequence is obtained by changing a position of a first subsequence in the first encoded bit sequence, and a length of the first subsequence is a positive integer multiple of a lifting factor; or
    the first reordered bit sequence is obtained by deleting a second subsequence in the first encoded bit sequence, and a length of the second subsequence is a positive integer multiple of a lifting factor.

11. The data processing device according to claim 9, wherein the programming instructions instruct the processor to: obtain the transport block; and generate, based on the transport block, N bit sequences that comprise the first to-be-processed bit sequence, wherein N is an integer greater than 0.

12. The data processing device according to claim 9, the programming instructions instruct the processor to:
    interleave the first output bit sequence.

13. The data processing device according to claim 9, the programming instructions instruct the processor to:
    generate a vector sequence based on the first output bit sequence, wherein the vector sequence comprises Q vectors of the first output bit sequence, each vector of the first output bit sequence comprises at least one bit of the first output bit sequence, and Q is a positive integer; and interleave the vector sequence.

14. The data processing device according to claim 13, wherein
    the vector sequence further comprises vectors generated based on a second output bit sequence, and each vector of the second output bit sequence comprises at least one bit of the second output bit sequence.

15. The data processing device according to claim 13, wherein the programming instructions instruct the processor to:
    interleave the vectors comprised in the vector sequence.

16. The data processing device according to claim 13, wherein the programming instructions instruct the processor to:
    perform intra-vector-subsequence interleaving on each vector subsequence comprised in the vector sequence to obtain M interleaved subsequences, wherein the vector sequence comprises M vector subsequences, and a quantity of vectors comprised in each vector subsequence is a positive integer multiple of a quantity of vectors comprised in a time domain symbol on a channel used to transmit the transport block within one transmission time interval.

17. A non-transitory computer readable medium comprising computer program codes stored thereon, executable by one or more digital processors for providing data procession, the computer program codes including:
    instructions for obtaining a first to-be-processed bit sequence, wherein the first to-be-processed bit sequence is a transport block or a code block generated by performing code block segmentation on a transport block;
    instructions for encoding the first to-be-processed bit sequence to obtain a first encoded bit sequence; and
    instructions for outputting a first output bit sequence from bits stored in a circular buffer, wherein
    the circular buffer is configured to store all or some bits of the first encoded bit sequence, or the circular buffer is configured to store all or some bits of a first reordered bit sequence that is obtained by performing bit reordering on the first encoded bit sequence, and a size of the circular buffer is determined based on a virtual buffer of a receiving device.

18. The non-transitory computer readable medium according to claim 17, wherein the first reordered bit sequence is obtained by changing a position of a first subsequence in the first encoded bit sequence, and a length of the first subsequence is a positive integer multiple of a lifting factor; or
    the first reordered bit sequence is obtained by deleting a second subsequence in the first encoded bit sequence, and a length of the second subsequence is a positive integer multiple of a lifting factor.

19. The non-transitory computer readable medium according to claim 17, wherein the computer program codes including:
    instructions for interleaving the first output bit sequence.

20. The non-transitory computer readable medium according to claim 17, wherein the computer program codes including:
    instructions for generating a vector sequence based on the first output bit sequence, wherein the vector sequence comprises Q vectors of the first output bit sequence, each vector of the first output bit sequence comprises at least one bit of the first output bit sequence, and Q is a positive integer; and
    instructions for interleaving the vector sequence.

* * * * *